US008138615B2

(12) United States Patent
Fukamizu et al.

(10) Patent No.: US 8,138,615 B2
(45) Date of Patent: *Mar. 20, 2012

(54) SEMICONDUCTOR INTEGRATED CIRCUIT PROVIDING FOR WIRE BONDING DIRECTLY ABOVE AN ACTIVE CIRCUIT REGION, AND MANUFACTURING METHOD THEREOF

(75) Inventors: Shingo Fukamizu, Osaka (JP); Yutaka Nabeshima, Osaka (JP); Yasunori Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 560 days.

This patent is subject to a terminal disclaimer.

(21) Appl. No.: 11/946,282

(22) Filed: Nov. 28, 2007

(65) Prior Publication Data

US 2008/0128755 A1 Jun. 5, 2008

(30) Foreign Application Priority Data

Dec. 1, 2006 (JP) ................................. 2006-325458

(51) Int. Cl.
H01L 23/48 (2006.01)

(52) U.S. Cl. ......................... 257/784; 257/691; 257/203

(58) Field of Classification Search .................. 257/691, 257/784
See application file for complete search history.

(56) References Cited

U.S. PATENT DOCUMENTS

2002/0011674 A1 1/2002 Efland et al.
2005/0046009 A1* 3/2005 Russell et al. ................ 257/691
2008/0099783 A1* 5/2008 Fukamizu et al. ............ 257/177
2008/0128826 A1* 6/2008 Fukamizu et al. ............ 257/379
2008/0203577 A1* 8/2008 Fukamizu et al. ............ 257/773

FOREIGN PATENT DOCUMENTS

| JP | 2974022 | 9/1999 |
|---|---|---|
| JP | 2000-114309 | 4/2000 |
| JP | 2004-363340 | 12/2004 |
| JP | 3725527 | 9/2005 |

OTHER PUBLICATIONS

U.S. Appl. No. 11/945,605, filed Nov. 27, 2007, Fukamizu et al.
U.S. Appl. No. 11/976,963, filed Oct. 30, 2007, Fukamizu et al.
U.S. Appl. No. 12/038,060, filed Feb. 27, 2008.

* cited by examiner

Primary Examiner — Thao Le
Assistant Examiner — Geoffrey Ida
(74) Attorney, Agent, or Firm — McDermott Will & Emery LLP

(57) ABSTRACT

A semiconductor integrated circuit relating to one aspect of the present invention includes a power transistor, at least one or more of first metal patterns functioning as a first electrode of the power transistor and at least one or more of second metal patterns functioning as a second electrode of the power transistor formed in an interlayer insulation film on the transistor, at least one or more of first busses electrically connected to a corresponding first metal pattern of the at least one or more of the first metal patterns, a single second bus electrically connected to the at least one or more of second metal patterns, and a contact pad provided to each of the at least one or more of first busses and the single second bus.

11 Claims, 13 Drawing Sheets

FIG. 5
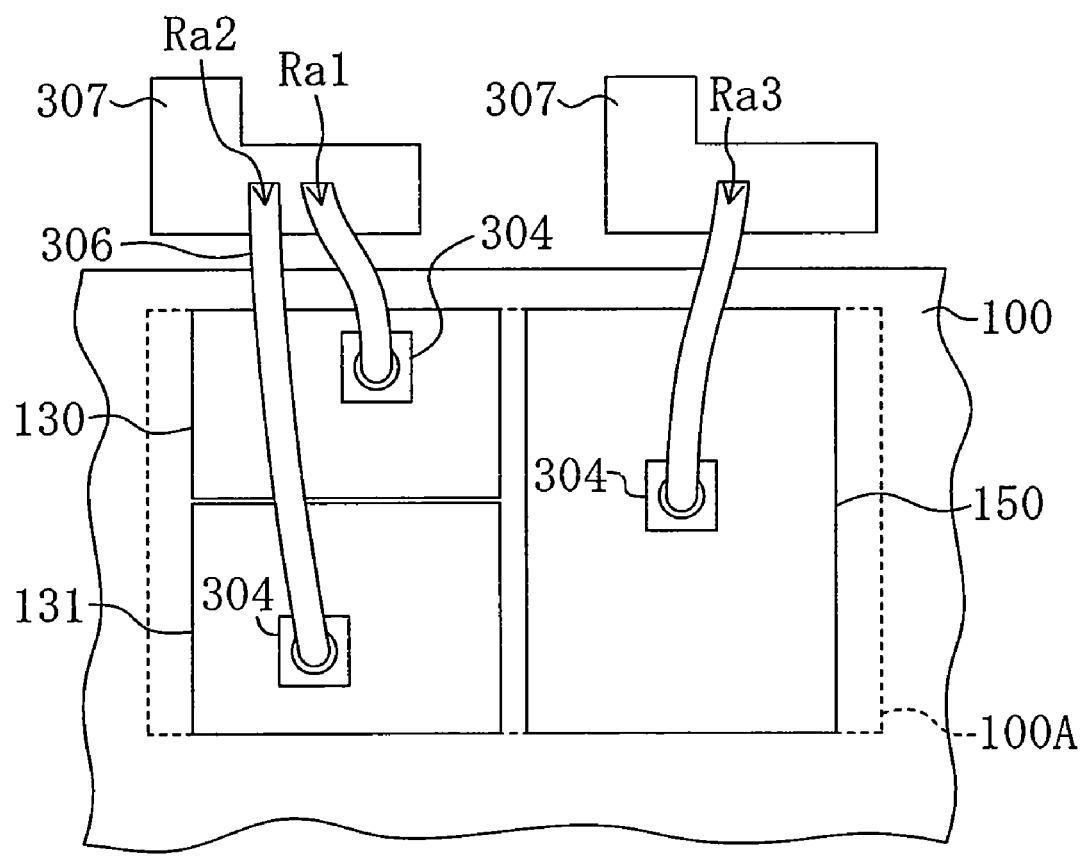
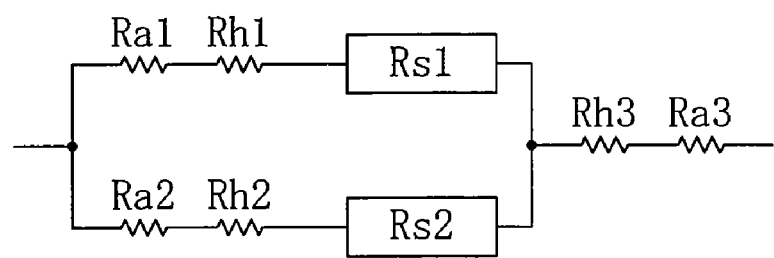

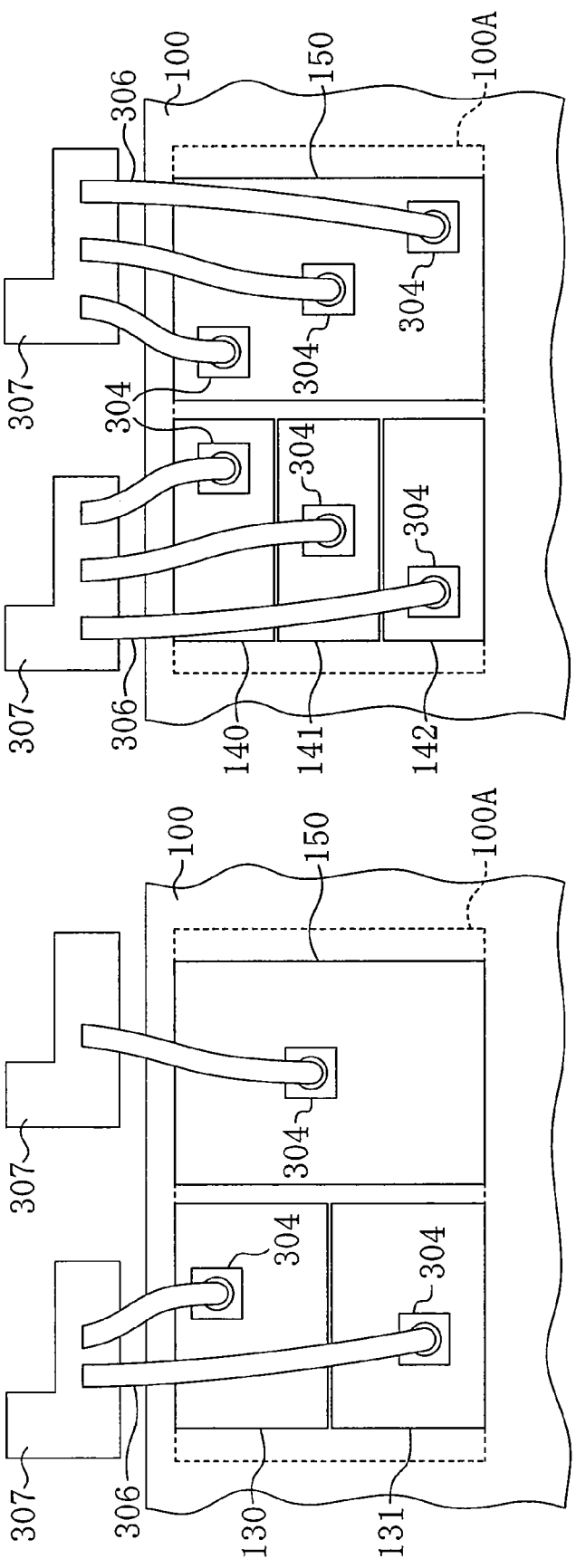

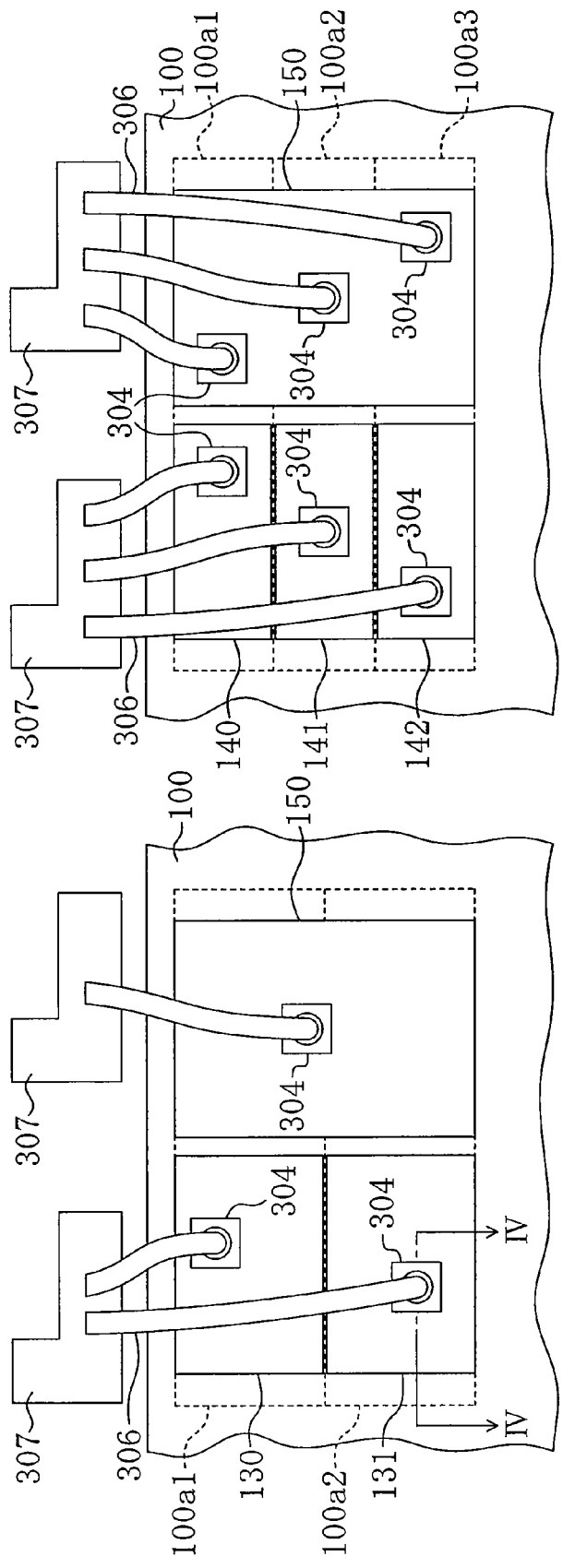

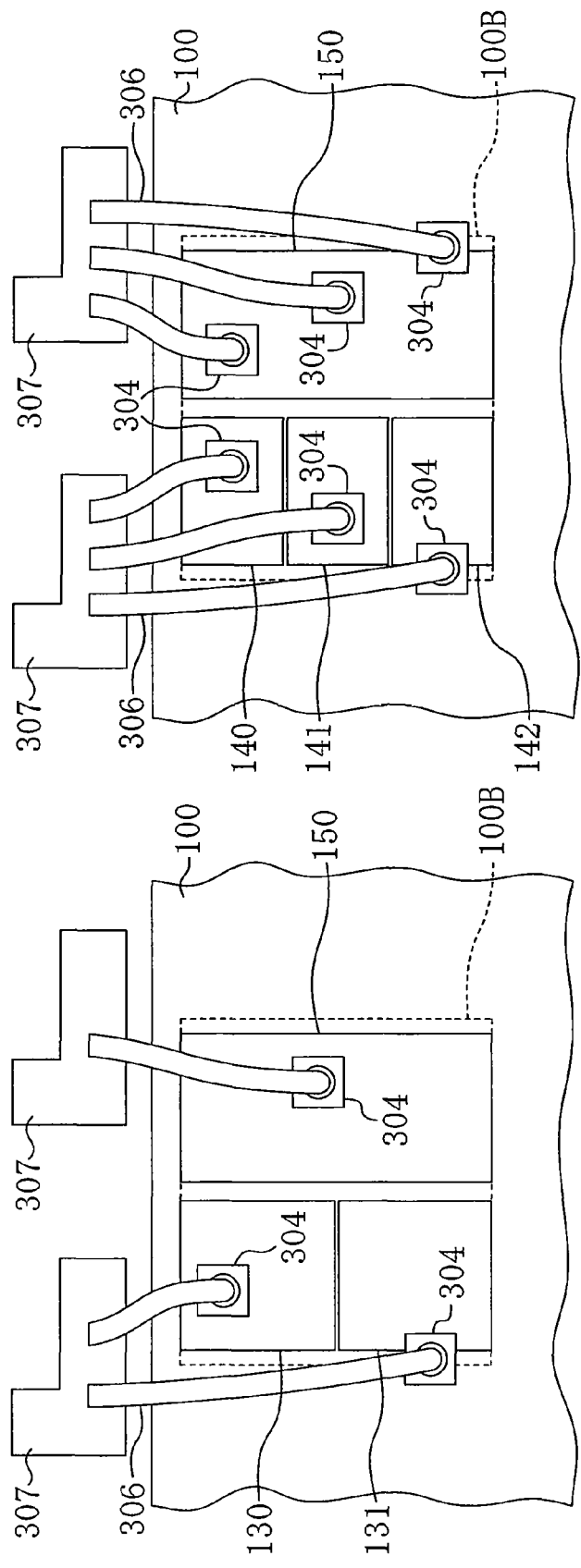

FIG. 13
PRIOR ART
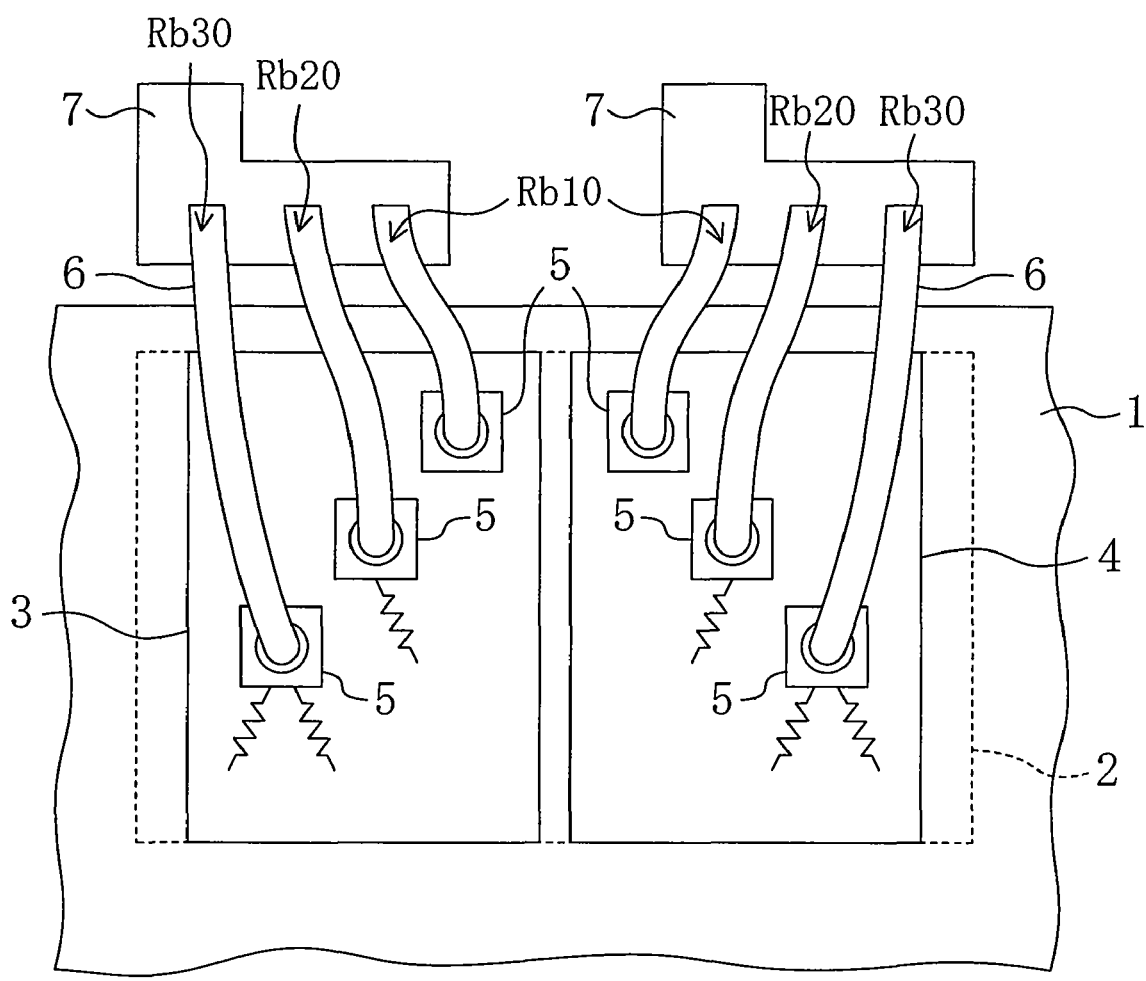
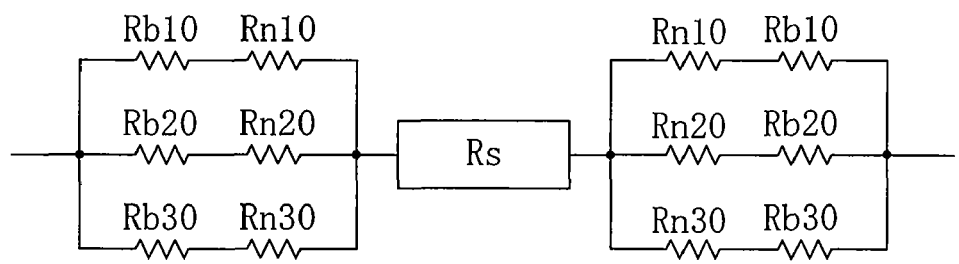

SEMICONDUCTOR INTEGRATED CIRCUIT PROVIDING FOR WIRE BONDING DIRECTLY ABOVE AN ACTIVE CIRCUIT REGION, AND MANUFACTURING METHOD THEREOF

BACKGROUND OF THE INVENTION

The present invention relates to a semiconductor integrated circuit and manufacturing method thereof and, in particular, relates to a power integrated circuit having construction which enables execution of wire bonding immediately above an active circuit region by utilizing a POE (Pad on Element) technique, namely, a technique for disposing a pad immediately above a semiconductor device, and to manufacturing method thereof.

In recent years, together with widespread use of information technology, needs for speeding up and low power consumption feature have been increasing to be developed as capabilities of electronic equipment such as computers, information storage devices, cellular phones, and portable cameras.

As factors having significant influences on performance of these electronic equipment, core semiconductor electronic parts such as power supply, motor driver, and audio amplifier are mentioned, and as an item which has significant influences on performance of these semiconductor parts, power integrated circuit incorporating power device is mentioned. Therefore, for performance of semiconductor elements constituting the power integrated circuit, requests for further speeding up and lower power consumption feature have been becoming remarkable.

In the meantime, as general requests from the ordinary market, in addition to above-mentioned speeding up and low power consumption feature, major improvements of power devices and circuit characteristics are desired. There are many requests for low-cost and reliable construction and method which are enabled by formation of bond of wire balls and solder balls on immediately above the active circuit region, and many proposals are presented.

Hereafter, first, conventional technology used before introduction of POE technology, a technology by which a pad is provided immediately above the semiconductor device, will be explained briefly.

A member connecting a pad and an external lead frame is a bonding wire. As materials used for the bonding wire, pure or alloy gold, copper, and aluminum are mentioned. When gold is used as the material, diameter of the bonding wire normally used is in a range from approximately 20 to 50 μm, and for wire ball bonding, a ball is normally mounted to a chip. Accordingly, when a ball is crushed to typical nail-head profile by a bonding capillary at bonding work, the area of the pad should be large enough to enable securement of the ball. Since diameter of the ball in free state is typically in a range from approximately 1.2 to 1.6 times the wire diameter, profile of a contact pad should be a square in a range from approximately 50×50 μm-150×150 μm depending on process parameters. Further, when solder ball is used for connecting member, ball diameter is typically in a range from approximately 0.2 to 0.5 mm, while the area of the contact pad should be a square in a range from approximately 0.3 to 0.7 mm. Here, expression of "solder ball" does not necessarily mean that solder contact is spherical, and diversified profiles including semispherical, half dome, cut conical shape or ordinary bump may be used. Accurate shape is depending on deposition technology, reflow technology, and material composition.

Further, contact pads are normally disposed in essentially straight array along with circumference of the chip, thereby consuming large area "silicon resources" (chips are produced on a substrate made predominantly of silicon semiconductor materials). Semiconductor circuits emerged recently require large numbers of contact pads and its number could reach frequently several hundreds even with ground connection and power connection alone. If signal connection is included, contact pads over 1000 pieces are necessary, thereby sacrificing a large amount of precious silicon resources.

Further, it is known from experiences over several years that wire bonding process exerts a sizable stress to a layer under the metal and dielectric body. Causes for this problem are impact of bonding capillary (nail-headed contact is formed by crushing a golden ball), frequency and energy of supersonic vibration of bonding capillary and golden balls (oxidized aluminum film on the surface of the exposed metal layer is broken), and time and temperature of the process (to initiate formation of inter-metal compound of gold/aluminum deposition). In order to avoid risks for generation of cracking or crater to a layer under the bonding pad due to stress during wire bonding process or stress given by device actuation after multiprobe test and assembly, design rules relating to layout of semiconductor integrated circuits, which prohibit circuit structure disposed in the region under the bonding pad and avoid the use of dielectric body materials which are damaged easily and are mechanically weak, are established in the past several years. For this reason, a large quantity of silicon resources is necessary to provide bonding pad alone.

Against such a background, requests for speeding up and low power consumption feature of semiconductor integrated circuits as mentioned above are increasing together with substantial improvement of power device and circuit characteristics, and request for low-cost and reliable construction and method which are enabled by formation of bond of wire balls and solder balls immediately above the active circuit region.

[Speeding Up of Semiconductor Integrated Circuits]

First, factors which disturb speeding up of semiconductor integrated circuits are delay in MOS transistor itself and wiring delay by wirings located at an upper layer thereon. With conventional technology, delay in MOS transistor itself was reduced by fine technology which could make gate length shorter. However, as delay in MOS transistor itself is made smaller, problems associated with wiring delay are becoming outstanding accordingly.

Then, for a purpose of reducing the wiring delay, it is attempted to employ an insulation film (low-dielectric constant film) with low dielectric constant to the insulation film sandwiched between wirings. Meanwhile, with a low-dielectric constant film which realizes dielectric constant not more than 3.0, mechanical strength is greatly reduced compared to a silicon oxidized film which is used conventionally, and problems arise in assembly step responsible for packaging of semiconductor integrated circuits, especially in wire bonding step, upon completion of diffusion step responsible for circuit formation of semiconductor integrated circuits.

Specifically, since mechanical strength of an interlayer insulation film is not sufficient, if wire bonding is performed on the pad mounted on the semiconductor integrated circuit, impact load of the wire bonding is conveyed to the interlayer insulation film immediately below the pad via the pad, thereby greatly deforming the interlayer insulation film. As a result, a crack is caused to the interlayer insulation film which results in poor reliability due to separation of the pad or separation of the interlayer insulation film. Further in recent years, for the sake of reduction in costs by reducing dimensions of the semiconductor elements, a semiconductor element with a pad mounted on transistors constituting an active circuit region is developed. With this semiconductor, if a low-dielectric constant film with low mechanical strength is used between wirings or for the interlayer insulation film, the transistor is damaged due to that the low-dielectric constant film is deformed by impact of wire bonding and the impact can be easily conveyed to the transistor, thereby causing poor quality.

In the meantime, according to Patent Document 1 (Japanese Patent No. 2974022), a metal layer is formed immediately below the pad so as to sandwich an interlayer insulation film, the metal layer and the pad are connected by a via, an impact exerted to the interlayer insulation film by wire bonding is then received by the metal layer and at the same time, possible deformation of the metal layer in impact exertion direction is supported by the via. As mentioned, according to Patent Document 1, damage to the transistor by wire bonding is suppressed by providing a pad structure which makes up reduction in mechanical strength of the interlayer insulation film formed immediately below the pad.

Meanwhile, when copper is adopted as the metal material, copper wiring will be formed by damascene process. If the area of the copper pattern, which is soft in nature, is made greatly large, its center portion is scraped by CMP (Chemical Mechanical Polishing) performed for flattening of plated copper after electroplating of the copper, and its film thickness is made very thin; this is referred to as dishing. Further, in order to form a fine via pattern in the lower layer, if the area of copper pattern is made greatly large by thinning of film thickness of the metal layer, the copper is scraped thoroughly by CMP at certain portion.

In this regard, with the technology disclosed by Patent Document 1, at formation of a second metal layer, namely at copper formation, above-mentioned phenomenon occurs. When center portion of the copper pattern is made thinner or copper is scraped thoroughly as mentioned above, impact of wire bonding received by the interlayer insulation film is increased and possibility of crack generation increases.

In contrast, according to Patent Document 2 (Japanese Patent No. 3725527), a pad structure, which is capable of preventing damage due to wire bonding with regard to an insulation film immediately below the pad and transistor, is provided. Namely, a semiconductor apparatus of the Patent Document 2 comprises a first electrode comprising a conductive layer, an outside connection electrode comprising a conductive layer formed on the first electrode, a second electrode of at least one layer connected via the first electrode and a through-hole to lower part of the first electrode, and has many convex configurations at periphery of the second electrode.

In this way, with such a construction that a metal layer sandwiched by an uppermost layer metal and the interlayer insulation film (hereafter referred to as the lower layer metal) is connected by the via, it is possible to prevent deformation or crack of the low-dielectric constant film adopted between wirings immediately below the pad and to the insulation film between layers due to impact of wire bonding. In other words, since the uppermost layer metal is supported by the lower layer metal against impact of wire bonding, no deformation occurs even if exposed to impact of wire bonding. As a result, impact of wire bonding conveyed to the low-dielectric constant film that serves as the interlayer insulation film immediately below the pad is suppressed, thereby preventing deformation or crack occurrence of the low-dielectric constant film.

Further, for the sake of prevention of dishing of CMP due to the enlarged area of the lower layer metal, many convex configurations are provided at periphery of the lower layer metal, the surface area of the lower layer metal is then enlarged, adhesion with the interlayer film is enhanced, and hence damage to the transistors due to impact of wire bonding can be reduced and at the same time, crack occurrence to the interlayer insulation film can be prevented.

As mentioned above, according to the pad structure employed in Patent Document 2, damage of the insulation film immediately below the pad and transistors due to wire bonding is prevented and this eventually contributes to speeding up of semiconductor integrated circuits.

[Lower Power Consumption Feature of Semiconductor Integrated Circuits]

Next, what impairs lower power consumption attempt of semiconductor integrated circuits is realization of a power integrated circuit incorporating a power device while the chip area is made as small as possible utilizing miniaturization MOS process and effectively utilizing the chip area of semiconductor products. For such power integrated circuit, for the sake of realization of lower power consumption feature, PWM (Pulse Width Modulation) driving technology is normally used for driving of the power device. With the PWM driving, reduction in ON resistance of the power device is an important process technology which results in lower power consumption feature.

Patent Document 3 (US 20020011674A1) proposes conventional related art by which ON resistance of the power device is reduced as much as possible utilizing POE technology. Namely, in a power integrated circuit which enables wire bonding immediately above an active circuit region portion, a plurality of contact pads are disposed immediately above the bus leading to electrodes of the power transistor utilizing POE technology, and a plurality of contact pads and lead frames are connected by bonding wire. With these features, resistance value and current pathway from the connecting member to the electrode are minimized, and electric characteristics of the power transistor can then be improved.

FIG. 13 shows simplified plan view of a part of the semiconductor integrated circuit described in Patent Document 3 and electric diagram.

As shown in the plan view of FIG. 13, an active region 2 of the power transistor is formed in an IC chip 1, and on the active region 2 are formed a first bus 3 which is composed of sheet-like metal and is connected to all source electrodes, and a second bus 4 which is connected to all drain electrodes. On the first bus 3 and the second bus 4 are provided each three contact pads 5 and are connected commonly to each of the busses. Three contact pads 5 on the first bus 3 are disposed so as to be bilaterally-symmetric with three contact pads 5 on the second bus 3. A bonding wire 6 connecting each of the contact pads 5 and an external lead frame 7 is provided.

The electric diagram shown in FIG. 13 schematically shows electrical features relating to operations of the power transistor brought by that a connecting member to the lead frame 7 is disposed on the power transistor. Resistance Rs across source and drain of transistor itself, spreading resistance (bus resistance) Rn10, Rn20, Rn30 on the bus and various wire resistances Rb10, Rb20, Rb30 are shown on the electric diagram.

As shown in FIG. 13, the electric circuit looking from the lead frame 7 is such a resistance circuit where bus resistances Rn10, Rn20, Rn30 are connected in series to each of wire resistances Rb10, Rb20, Rb30 of three bonding wires 6 which are connected in parallel to the lead frame 7, and across source-drain resistance Rs of the transistor itself is further connected. In this way, by the fact that each of bus resistances Rn (10-30) is connected in series to various wire resistances Rb (10-30), bus resistance Rn (10-30) and wire resistance Rb (10-30) are eventually connected to each other in parallel, and whole resistance composed of source-drain resistance Rs, bus resistance Rn (10-30) and wire resistance Rb (10-30) is reduced. In other words, since voltage drop related to across source-drain resistance Rs, bus resistance Rn (10-30) and wire resistance Rb (10-30), and corresponding device effects are lowered, transistor characteristics are improved.

Meanwhile, as shown in Patent Document 3, for the purpose of minimization of resistance value and current pathway from the connecting member to the electrode, in the power integrated circuit capable of performing wire bonding immediately above the active circuit region portion, on each one of busses to be connected to the source electrode and busses to be connected to the drain electrode of the power transistor are disposed a plurality of contact pads in distributed fashion so as to be located immediately above the power transistor.

However, busses connected to the source electrode and the drain electrode of the power transistor are all commonly connected to a plurality of contact pads, it is difficult to attempt minimization of IC chips by mask layout of the semiconductor integrated circuit (IC chip) incorporating the power transistor and at the same time to equalize currents flowing through each of power transistors by identifying current routes leading to each of power transistors.

Further, there was such a problem that when a large current is introduced to the power transistor, since busses connected to the source electrode and the drain electrode of the power transistor are all commonly connected to each of a plurality of contact pads, current crowding is caused to the power transistor thereby giving a damage thereto depending on types of the power device (e.g., power NPN transistor) and on layout of the bus connected to the electrodes, and reliability of the semiconductor integrated circuit is eventually hampered.

SUMMARY OF THE INVENTION

In light of the above, a purpose of the present invention is to provide a semiconductor integrated circuit with excellent reliability by identifying a current route leading to a power transistor and optimizing the current flowing through the power transistor to reduce damage or stress exerted to the power transistor, and manufacturing method thereof.

In order to accomplish aforementioned purpose, a semiconductor integrated circuit relating to one aspect of the present invention includes an integrated power transistor formed on a semiconductor substrate, an interlayer insulation film formed on the power transistor, at least one or more of first metal patterns which include a first metal layer formed immediately above the power transistor in the interlayer insulation film and function as a first electrode of the power transistor, at least one or more of second metal patterns which include the first metal layer and function as a second electrode of the power transistor, at least one or more of first busses which include a second metal layer formed immediately above the first metal layer in the interlayer insulation film and are electrically connected to a corresponding first metal pattern among at least one or more of first metal patterns, a single second bus which includes the second metal layer and is electrically connected to the at least one or more of second metal patterns, and contact pads provided to each of the at least one or more of first busses and to the single second bus.

According to the semiconductor integrated circuit relating to one aspect of the present invention, since current pathway of the power transistor is divided, a current route leading to each of the power transistors can be identified, and at the same time, equalization of current density flowing each of power transistor elements itself, and equalization of current flowing the bonding wire connected to each of power transistors can be attempted.

In the semiconductor integrated circuit relating to one aspect of the present invention, such a composition may be used that at least one or more of contact pads are provided to the single second bus.

With these features, current pathway leading to each of power transistors can be identified and at the same time, optimization of currents flowing each of power transistors can be attained, thereby improving current permissible level of the power transistor as a whole.

In the semiconductor integrated circuit relating to one aspect of the present invention, such a composition may be used that a plurality of power transistors are disposed at a corner part of the semiconductor integrated circuit chip, and each of contact pads disposed immediately above at least one or more of the power transistors is connected to a corresponding lead frame via a connecting member.

With these features, by disposing a plurality of power transistors at corner part of the semiconductor integrated circuit chip, both axes of the lead of a package disposed on vertical axis and horizontal axis of the package at wire bonding can be utilized. Therefore, degree of freedom of layout of the semiconductor integrated circuit chip is increased, power transistors can be disposed depending on type of the circuit towards minimization of chip size, and positional relationship between contact pads disposed on each of busses of at least one or more of power transistors, and the lead frame can be made appropriate. Accordingly, practical distance between the contact pad and lead of the package can be made shorter, and a plurality of wire bonding to individual terminal of the lead frame via a plurality of contact pads can be realized. Further, since bonding wire length can be made shorter, resistance component of the bonding wire that is one of resistance components of the power transistor can be reduced. By providing layout of power transistors in the semiconductor integrated circuit chip as mentioned above, it is possible to dispose power supplying contact pads immediately above the power transistor while a current route flowing through each of the power transistors is identified, thereby saving valuable silicon resources.

In the semiconductor integrated circuit relating to one aspect of the present invention, such a composition may be used that each of the at least one or more of first busses has a different surface area.

With these features, resistance component due to bonding wire length is taken into considerations and is utilized for designing of size of the bus, and the area size of the bus divided can be adjusted. With these features, with regard to a combined resistance of resistance component of each of bonding wires, element resistance of each of power transistors, and bus resistance component looking from the lead frame, size design of wire length of the bonding wire and each power transistor, and bus design can be realized so that current density may become uniform for each power transistor and equalization of loads of the power transistors elements themselves can be attained. As a result, reliability of the semiconductor integrated circuit is improved. Further, designing of size of wire length of bonding wire, each of power transistors, and designing of bus can be realized so that a combined resistance of resistance component of each of bonding wires, element resistance of each of power transistors, and bus resistance component looking from the lead frame may become uniform for each of the current pathways, and equalization of loads of the bonding wires can be attained. As a result, reliability of the semiconductor integrated circuit is improved.

In the semiconductor integrated circuit relating to one aspect of the present invention, such a composition may be used that each of the at least one or more of first busses has the same surface area.

With this consideration, ESD energy is dispersed from the lead frame to which ESD energy is applied directly, via bonding wire, at the rate of the number of busses divided and therefore, a peak value of ESD energy applied to each of the power transistor elements is lowered by that much. This allows improvement of ESD proof strength of the power transistor, thereby improving reliability of the semiconductor integrated circuit.

In the semiconductor integrated circuit relating to one aspect of the present invention, the power transistor is preferably divided into a plurality of members by a separating layer so as to correspond to each of the at least one or more of first busses.

With this consideration, since the power transistor is enclosed by the separating layer, erroneous operations such as latch and parasitism hardly occur and reliability of the semiconductor integrated circuit can be further improved.

In the semiconductor integrated circuit relating to one aspect of the present invention, the size in plan view of the power transistor is more than the size of each of the contact pads.

With this consideration, array of power supply contact pads distributed on the power transistor, a means for supplying primarily vertical direction current from the contact pad to the power transistor with distributed manner, and a means for connecting a power supply to each of the contact pads are included. In this way, contact pads for power supplying are disposed immediately above the power transistor, thereby saving valuable silicon resources. Namely, costs of IC chips can be reduced by reducing the chip area consumed by contact pads. In this way, saving of area for IC chips can be attained, thereby realizing cost reduction of IC chips.

In the semiconductor integrated circuit relating to one aspect of the present invention, each of the contact pads is preferably, in plan view, included in a region where the power transistor is formed.

With this consideration, for saving of area for IC chips and cost reduction of IC chips, same effects as mentioned above can be nearly realized.

In the semiconductor integrated circuit relating to one aspect of the present invention, it is preferable that some of the contact pads are, in plan view, protruded in part from a region where the power transistor is formed.

With this consideration, saving of area for IC chips and cost reduction of IC chips can be realized while short-circuiting across outputs due to contact of the bonding wire is well prevented.

In the semiconductor integrated circuit relating to one aspect of the present invention, it is preferable that some of the contact pads are, in plan view, protruded entirely from a region where the power transistor is formed.

With this consideration, saving of area of the IC chips and cost reduction of IC chips can be realized while short-circuiting across outputs due to contact of the bonding wire is well prevented.

A method for manufacturing a semiconductor integrated circuit relating to one aspect of the present invention includes the steps of: forming a integrated power transistor on a semiconductor substrate; forming a first interlayer insulation film on the power transistor; forming at least one or more of first metal patterns functioning as a first electrode of the power transistor and at least one or more of second metal patterns functioning as a second electrode of the power transistor, by patterning a first metal layer, after the first metal layer is deposited immediately above the power transistor via the first interlayer insulation film; forming a second interlayer insulation film above the first interlayer insulation film so as to cover the at least one or more of the first metal patterns and the at least one or more of the second metal patterns; forming at least one or more of first busses electrically connected to a corresponding first metal pattern of the at least one or more of the first metal patterns and a single second bus electrically connected to the at least one or more of the second metal patterns, by patterning the second metal layer, after the second metal layer is deposited immediately above the first metal layer via the second interlayer insulation film; forming a third interlayer insulation film above the second interlayer insulation film so as to cover the at least one or more of first busses and the single second bus; forming at least one or more of openings to the third interlayer insulation film so as to expose each of the at least one or more of the first busses and the single second bus, and to be provided to each of the at least one or more of the first busses and the single second bus; providing a contact pad to each of the at least one or more of the first busses and the single second bus exposed through the at least one or more of openings; and mounting at least one or more of connecting members to the compact pad.

According to the manufacturing method of the semiconductor integrated circuit relating to one aspect of the present invention, a semiconductor integrated circuit relating to one aspect which develops aforementioned effects can be realized.

In the manufacturing method of the semiconductor integrated circuit relating to one aspect of the present invention, the step for forming at least one or more of openings may be substituted by that a plurality of openings are provided to the third interlayer film for the single second bus.

According to the semiconductor integrated circuit relating to one aspect of the present invention and the manufacturing method thereof, since current pathways of the power transistor are divided, current route leading to each of power transistors can be identified and at the same time, equalization of density of current flowing through each of power transistors themselves, and equalization of current flowing through the bonding wire connected to each of power transistors can be attained.

As effects developed by the semiconductor integrated circuit relating to one aspect of the present invention and manufacturing method thereof, general versatility of specifications and applications is enhanced, if a means for connecting a power supply includes mutual connection of wire bonding and solder balls.

Further, as effects developed by the semiconductor integrated circuit relating to one aspect of the present invention and manufacturing method thereof, by providing sufficient thickness to absorb mechanical, thermal, and impact stresses to the insulation layer separating the contact pad and circuit and to the pad metal layer, reliability of process and operation of semiconductor probed, wire bonded, and solder connected assemblies can be improved.

Further, as effects developed by the semiconductor integrated circuit relating to one aspect of the present invention and manufacturing method thereof, elimination of process related restrictions on probing, wire bonding, and solder connection becomes possible, and this allows minimization of a risk for generation of cracking damage even for a very brittle circuit dielectric body.

Further, as effects developed by the semiconductor integrated circuit relating to one aspect of the present invention and manufacturing method thereof, it is possible to present a versatile and flexible design and layout concept, and method of process applicable to many of semiconductor IC product groups and to products over several generations.

Further, as effects developed by the semiconductor integrated circuit relating to one aspect of the present invention and manufacturing method thereof, it is possible to present processes for low-cost and high-speed manufacturing, tests, and assemblies.

Further, as effects developed by the semiconductor integrated circuit relating to one aspect of the present invention and manufacturing method thereof, it is possible to use only designs and processes which are commonly used and accepted in the manufacturing of semiconductor IC products, and this feature saves additional capital investment and allows utilization of existing infrastructure of the manufacturing apparatuses.

BRIEF DESCRIPTION OF THE DRAWINGS

FIG. 5 is a simplified plan view showing schematically a part of IC chip, which is an important part of the semiconductor integrated circuit relating to a second embodiment of the present invention and has a bus metal layer divided into a plurality of busses, a bus metal layer serving as single bus, where one contact pad is disposed on each of busses and an electric diagram showing electric resistance along with flow of the current is shown under the plan view.

FIG. 6A is a simplified plan view showing schematically a part of IC chip, which is an important part of the semiconductor integrated circuit relating to the second embodiment of the present invention and has a bus metal layer divided into a plurality of busses, a bus metal layer serving as single bus, where one contact pad is disposed on each of busses, and FIG. 6B is a simplified plan view showing schematically a part of IC chip, which is an important part of the semiconductor integrated circuit relating to the second embodiment of the present invention and has a bus metal layer divided into a plurality of busses, a bus metal layer serving as single bus, where one contact pad is disposed on each of a plurality of busses, and a plurality of contact pads are disposed on the single bus.

FIG. 7A is a simplified plan view showing schematically a part of IC chip, which is an important part of a first modified example of the semiconductor integrated circuit relating to a third embodiment of the present invention and has a bus metal layer divided into a plurality of busses, a bus metal layer serving as single bus, where one contact pad is disposed on each of busses, and has such a composition that each of two divided power transistors is enclosed by the separating layer, and FIG. 7B is a simplified plan view showing schematically a part of IC chip, which is an important part of the first modified example of the semiconductor integrated circuit relating to the third embodiment of the present invention and has a bus metal layer divided into a plurality of busses, a bus metal layer serving as single bus, and has such a composition that one contact pad is disposed on each of a plurality of busses, a plurality of contact pads are disposed on the single bus, and each of three divided power transistors is enclosed by the separating layer.

FIG. 8A is a simplified plan view showing schematically a part of IC chip, which is an important part of the second modified example of the semiconductor integrated circuit relating to the third embodiment of the present invention and has a bus metal layer divided into a plurality of busses, bus a metal layer serving as a single bus, and has such a composition that one contact pad is disposed on each of busses, and some of the contact pads immediately above the device are protruded in part from the busses immediately below, and FIG. 8B is a simplified plan view showing schematically a part of IC chip, which is an important part of the second modified example of the semiconductor integrated circuit relating to the third embodiment of the present invention and has a bus metal layer divided into a plurality of busses, a bus metal layer serving as single bus, and has such a composition that one contact pad is disposed on each of a plurality of busses, a plurality of contact pads are disposed on the single bus, and some of the contact pads immediately above the device are protruded in part from the busses immediately below.

FIG. 13 is a simplified plan view showing schematically important part of IC chip including the power transistor having such a construction that a plurality of contact pads are disposed on each of the bus metal layers and are commonly connected on the bus metal layer, used in the prior art.

DESCRIPTION OF THE PREFERRED EMBODIMENTS

First Embodiment

A semiconductor integrated circuit relating to a first embodiment of the present invention and manufacturing method thereof will be explained hereafter referring to drawings.

Figures 1A, 1B:
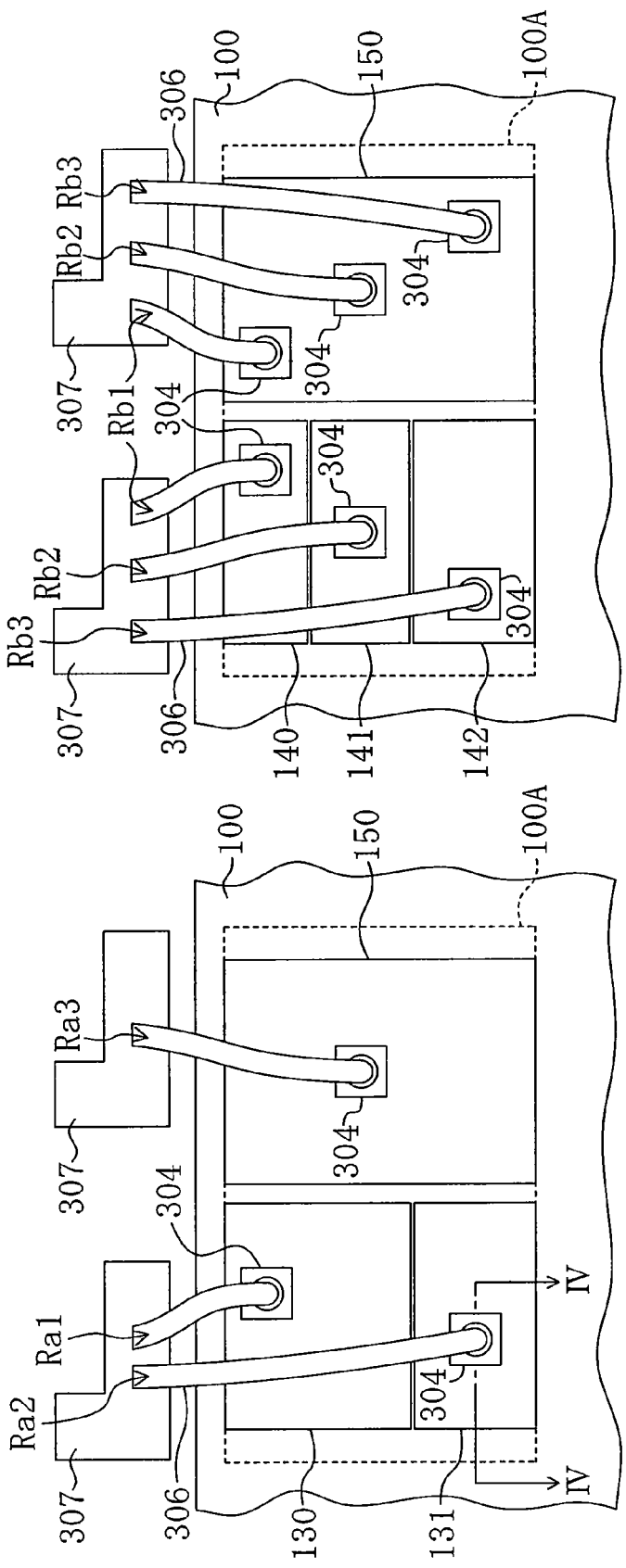
FIG. 1A is a simplified plan view showing schematically a part of IC chip, which is an important part of the semiconductor integrated circuit relating to a first embodiment of the present invention and has bus metal layers divided into a plurality of busses, and a bus metal layer that serves as single bus, where one contact pad is disposed on each of busses, and an electric diagram showing electric resistance along with flow of the current is shown under the plan view.
FIG. 1B is a simplified plan view showing schematically a part of IC chip, which is an important part of the semiconductor integrated circuit relating to a first embodiment of the present invention and has bus metal layers divided into a plurality of busses, and a bus metal layer that serves as single bus, where one contact pad is disposed on each of a plurality of busses, and a plurality of contact pads are disposed on the single bus, and an electric diagram showing electric resistance along with flow of the current is shown under the plan view.

FIGS. 1A and 1B are simplified plan views showing a part of the semiconductor integrated circuit relating to the first embodiment of the present invention, and electric diagrams are also shown.

In the plan view shown in FIG. 1A, the semiconductor integrated circuit including three busses disposed so as to cover source region and drain region of the power transistor is shown.

As shown in the plan view of FIG. 1A, an active region 100A of the power transistor is formed in an IC chip 100. On the active region 100A are formed busses 130 and 131 divided into two and single bus 150 so as to cover source and drain regions of the power transistor. Having busses 130 and 131 divided into two allows improvement of integration degree of ICs and enables saving of chip formation. Two busses 130, 131 are metal layers (third metal layers) at the uppermost layer composed of sheet-like metal, each bus being connected to the source electrode and separated from the other by an insulation layer. The single bus 150 is a metal layer (third metal layer) at the uppermost layer composed of sheet-like metal and is formed to be connected to the drain electrode. On each of busses 130, 131, 150 is formed one contact pad 304, respectively. One of external lead frames 307 (power supply) is provided for busses 130, 131, and a bonding wire 306 is provided so as to connect the lead frame 307 and each of contact pads 304. Further, one of external lead frames 307 is provided for the single bus 150, and each of bonding wires 306 is provided so as to connect the lead frame 307 and each of contact pads 304.

Further, as shown in the plan view of FIG. 1A, the area of two busses 130, 131 is different from each other, and busses 130, 131 are formed in that each area becomes gradually smaller from those closer to the lead frame 307 to those away therefrom.

The semiconductor integrated circuit relating to the embodiment having the structure shown in FIG. 1A has electrical features shown in the electric diagram shown under the plan view.

In other words, the electric diagram shown at lower part of FIG. 1A schematically shows electric features relating to operations of the power transistor which are brought by disposing connecting members apart from the lead frame 307. In this electric diagram, three resistances by the bonding wire 306 are represented by Ra1, Ra2, Ra3, and Ra1, Ra2 of them are connected in parallel with the lead frame 307. In two busses 130, 131 and the single bus 150, resistance with regard to electric current flowing through these busses is a spreading resistance of the bus, while these bus resistances are represented by Rg1, Rg2, Rg3, and across source-drain resistances of two transistor themselves are represented by Rs1, Rs2.

As shown in FIG. 1A, in the electric diagram looking from the lead frame 307, bus resistances Rg1, Rg2 are connected each in series to wire resistances Ra1, Ra2 of two bonding wires 306 which are connected in parallel with the lead frame 307, and further connected to one side of across source-drain resistances Rs1, Rs2 of transistor itself. Other side of across source-drain resistances Rs1, Rs2 of transistor itself is short-circuited by the single bus 150, connected to wire resistance Ra3 of one of bonding wires 306, and is connected to the lead frame 307 to form a resistance circuit.

Next, in the plan view of FIG. 1B, a semiconductor integrated circuit including four busses disposed to cover source region and drain region of the power transistor are shown. The semiconductor integrated circuit shown FIG. 1B is same as the semiconductor integrated circuit shown in FIG. 1A in that it includes a plurality of busses and single bus, but is different in that a plurality of contact pads are formed to the single bus.

As shown in the plan view of FIG. 1B, the active region 100A of the power transistor is formed within the IC chip 100. On the active region 100A are formed busses divided into three 140, 141, 142, and the single bus 150 so as to cover source and drain regions of the power transistor. Having busses divided into three 140, 141, 142 as mentioned allows improvement of integration degree of IC and saving of chips. Further, three busses 140, 141, 142 are metal layers at the uppermost layer (third metal layers) composed of sheet-like metal, each bus being connected to the source electrode and separated from the others by an insulation layer. Further, the single bus 150 is a metal layer at the uppermost layer (third metal layer) composed of sheet-like metal, and is formed to be connected to the drain electrode. On each of busses 140, 141, 142 is formed one contact pad 304, and on the single bus 150 are formed three contact pads so as to be bilaterally-symmetric with the contact pad 304 on each of busses 140, 141, 142. One of external lead frames 307 (power supply) is provided for busses 140, 141, 142, and each of bonding wires 306 is provided so as to connect the lead frame 307 and each of contact pads 304. Further, one of external lead frames 307 is provided for the single bus 150, and each of bonding wires 306 is provided so as to connect the lead frame 307 and each of contact pads 304.

As shown in the plan view of FIG. 1B, the area of three busses 140, 141, 142 is different from each other, and busses 140, 141, 142 are formed in that each area becomes gradually greater from those closer to the lead frame 307 to those away therefrom. Meanwhile, the area of each of busses 140, 141, 142 may be formed in similar fashion as FIG. 1A in that area becomes gradually smaller from those closer to the lead frame 307 to those away therefrom.

Here, the semiconductor integrated circuit relating to the present embodiment having a structure shown in FIG. 1B has electrical features shown in the electric diagram shown at lower part of FIG. 1B.

Namely, the electric diagram shown at lower part of FIG. 1B schematically shows electric features relating to operations of the power transistor brought by that the connecting member is disposed being kept away from the lead frame 307. Meanwhile, in the electric diagram, wire resistances by six bonding wires 306 each three being disposed bilaterally-symmetric as mentioned are represented by Rb1, Rb2, Rb3, and wire resistances Rb1, Rb2, Rb3 are connected in parallel with the lead frame 307. On three busses 140, 141, 142, resistance with regard to electric current flowing through these busses is a spreading resistance of the bus, and these spreading resistances are represented by Rn1, Rn2, Rn3. Likewise, in the single bus 150, resistance with regard to electric current flowing through the bus is a spreading resistance of the bus, and these spreading resistances are represented by Rm1, Rm2, Rm3. Further, across source-drain resistance of three transistors themselves are represented by Rs1, Rs2, Rs3.

As shown in FIG. 1B, in the electric diagram looking from the lead frame 307, wire resistances Rb1, Rb2, Rb3 of three bonding wires 307 being connected in parallel with the lead frame 307 are connected in series to each of bus resistances Rn1, Rn2, Rn3, and are further connected to one side of across source-drain resistances Rs1, Rs2, Rs3 of the transistor itself. Other side of across source-drain resistances Rs1, Rs2, Rs3 of the transistor itself is short-circuited by the single bus 150, and connected to wire resistances Rb1, Rb2, Rb3 of three bonding wires 306 via spreading resistances Rm1, Rm2, Rm3 in the single bus 150, thereby forming a resistance circuit connected to the lead frame 307.

In the meantime, the semiconductor integrated circuit shown in FIGS. 1A and 1B is an active circuit. Here, active circuit denotes various electric parts which provide functionality to ICs. In particular, as used herein, the active circuit denotes a metal layer which serves as a power bus of power transistors disposed in lateral direction.

Differences between the semiconductor integrated circuit shown in FIG. 1A and the semiconductor integrated circuit shown in FIG. 1B are as follows: Namely, the semiconductor integrated circuit shown in FIG. 1A can be utilized when allowable current value of each of bonding wires 306 is greater than a high current introduced to actual power transistor; with regard to a combined resistance of resistance component of each of bonding wires 306, element resistance of each of power transistors, and bus resistance component looking from the lead frame 307, wire length of the bonding wire 306, size design of each power transistor, and bus design can be realized so that current density may become uniform for each power transistor; and equalization of loads of each of power transistors themselves can be attained.

In the meantime, the semiconductor integrated circuit shown in FIG. 1B can be utilized when allowable current value of each of bonding wires 306 is smaller than a high current introduced to actual power transistor; wire length of the bonding wire 306, size design of each power transistor, and bus design can be realized so that a combined resistance of resistance component of each of bonding wires 306, element resistance of each of power transistors, and bus resistance component looking from the lead frame 307 may become uniform; and equalization of loads of each of bonding wires 306 can be attained.

Further, in the semiconductor integrated circuit shown in FIG. 1B, since a plurality of contact pads 304 are connected to the single bus 150, allowable current value can be increased as the number of bonding wires 306 is increased, and it is possible to eliminate restrictions on the bonding wire 306 at high current state, and resistance component of the bonding wire 306 in the whole resistance of the transistor can be reduced. In this way, current path way leading to each of power transistors can identified while lower resistance feature of the power transistor is attained, and optimization of the current flowing through each power transistor can be attained, thereby increasing allowable current value of the power transistor as a whole.

Further, as it is apparent from comparison between the electric circuit shown in FIGS. 1A and 1B, and the electric circuit shown in FIG. 13 which is explained in the prior art, with prior art, a plurality of contact pads are connected commonly to metal layer bus of the uppermost layer and hence one current pathway is used for the power transistors themselves, while in the present embodiment, in order to have one bus for one contact pad, two busses 131, 132 are provided so as to be corresponding to each of two contact pads 304 (see FIG. 1A), or three busses 140, 141, 142 are provided so as to be corresponding to each of three contact pads 304 (see FIG. 1B), the power transistor is divided in two or three, and the current pathway of the power transistor is also divide in two or three. For this reason, a current route flowing through each of the power transistors can be identified while damage or stress due to current crowding to the power transistor is avoided, and at the same time, optimization of the current flowing each of the power transistors is made possible. Therefore, current permissible level of the power transistor can be increased as a whole, and a semiconductor integrated circuit with excellent reliability can be realized.

Further, when a large bus area is divided into appropriate size portions, and the contact pad 304 is disposed to each of two busses 131, 132 (see FIG. 1A) or three busses 140, 141, 142 (see FIG. 1B), the current pathway is divided, and damage to the power transistor due to unforeseen current crowding is prevented.

Further, in FIGS. 1A and 1B, as bus layout, although explanation is given for a case where a plurality of busses (busses 131, 132 in FIG. 1A, busses 140, 141, 142 in FIG. 1B) are disposed upper/lower, same effects are obtainable for a case where bus arrangement for dividing current pathway is divided nearly upper and lower, nearly right and left, or nearly diagonally.

Effects of aforementioned semiconductor integrated circuit shown in FIGS. 1A and 1B will be explained hereafter using concrete examples.

First, for the semiconductor integrated circuit shown in FIG. 1A, for example, wire resistance per unit length of the bonding wire 306 is supposed to be 50 m$\Omega$/mm, wire length of each bonding wires 306 connected to source side is designed to be 1 mm, 2 mm, and wire length of each bonding wires 306 connected to drain side is designed to be 1.5 mm. With this design, it is supposed that three resistances due to wire length of each bonding wire 306 are designed to be Ra1=0.05 $\Omega$, Ra2=0.1 $\Omega$, Ra3=0.75 $\Omega$; spreading resistance of two source side busses are designed to be Rg1=0.07 $\Omega$, Rg2=0.14 $\Omega$; total of spreading resistance of one drain side bus is designed to be Rg3=0.047 $\Omega$ considering one contact pad 304; across source-drain resistance of transistor itself is designed to be Rs1=0.07 Ω, Rs2=0.14 Ω. With this consideration, resistance value from the bonding wire 306 connected to the source side of the power transistor till the drain side of the power transistor element itself, if represented by each series resistance of resistance component of each bonding wire 306, element resistance of each power transistor, and resistance component of the source side bus, the following equation is established:

(Ra1+Rg1+Rs1)×2

=*Ra*2+*Rg*2+*Rs*2=0.38Ω

In other words, if wire length of bonding wire, size of each power transistor, and bus are designed so that density of the electric current flowing through each of power transistor itself may become uniform, power transistor element composing resistance Rs1 allows flowing of twice electric current than the power transistor element constituting across source-drain resistance Rs2. Since size of the transistor is approximately twice, density of the electric current flowing through each of power transistor becomes uniform.

Further, if resistance value from the single bus 150 connected to the drain side of the power transistor element itself till the bonding wire 306 connected to the lead frame 307 is represented by each series resistance of resistance component of each bonding wire 306, element resistance of each power transistor, and resistance component of the source side, the following equation is established:

*Ra*3+*Rg*3=0.122Ω

From above discussions, resistance of the power transistor across two terminals of the lead frame 307 is calculated to be 0.248 Ω.

In FIG. 1A, it is supposed that wire resistance by wire length of each bonding wire 306 is represented by Ra1, Ra2, Ra3, spreading resistance by source side busses 130, 131 is represented by Rg1, Rg2, spreading resistance by drain side single bus is represented by Rg3, and across source-drain resistance of the transistor itself is represented by Rs1, Rs2, and that parameters of each of resistance numerical value are designed appropriately.

The following equation is established for resistance of the power transistor across two terminals of the lead frame 307 including each series resistance value of resistance component of each bonding wire 306, element resistance of each power transistor, and bus resistance component:

Resistance of the power transistor across two terminals of the lead frame

=1/(1/(*Ra*1+*Rg*1+*Rs*1)

+1/(Ra2+Rg2+Rs2))+Ra3+Rh3

Meanwhile, in the semiconductor integrated circuit shown in FIG. 1A, although explanation is given for a case where two busses 130, 131 are disposed at the source side, the single bus 150 is disposed at drain side, the present embodiment is not limited thereto. For example, same effects are obtainable even if the number of busses at source side is three, four, or the like, and it goes without saying that same effects are obtained in such a case where single bus is provided at the source side and two busses are provided at the drain side. In other words, in the present embodiment, it goes without saying that same effects are obtained even if bus arrangement is such one being divided into several portions, nearly upper and lower, nearly right and left, or nearly diagonally, as long as bus arrangement for dividing current pathways of the bus at either source side or drain side is employed.

Next, for semiconductor integrated circuit shown in FIG. 1B, it is supposed that, for example, resistance value per unit length of the bonding wire 306 is 50 mΩ/mm, wire length of each of bonding wires 306 connected to the source side is designed to be 1 mm, 1.5 mm, 2 mm, and wire length of each of bonding wires 306 connected to the drain side is designed similarly. With this design, it is supposed that three wire resistances by wire length of each of bonding wires 306 can be designed to be Rb1=0.05 Ω, Rb2=0.075 Ω, Rb3=0.1 Ω, three spreading resistances of bus at source side can be designed to be Rn1=0.15 Ω, Rn2=0.14 Ω, Rn3=0.13 Ω, total spreading resistance of single bus at drain side can be designed to be Rm=0.046 Ω taking three contact pads 304 into considerations, and across source-drain resistance of the transistor itself can be designed to be Rs1=0.155 Ω, Rs2=0.14 Ω, Rs3=0.125 Ω. With this design, resistance value from the bonding wire 306 connected to the source side of the power transistor till the drain side of the power transistor element itself, if represented by each series resistance of resistance component of each bonding wire 306, element resistance of each power transistor, and bus resistance component of the source side, the following equation is established:

Rb1+Rn1+Rs1

=*Rb*2+*Rn*2+*Rs*2

=*Rb*3+*Rn*3+*Rs*3=0.355Ω

Further, resistance value from the single bus 150 connected to drain side of the power transistor element itself till the bonding wire 306 connected to the lead frame 307, if represented by each series resistance of resistance component of each bonding wire 306 Rb=0.023 Ω, resistance component of the source side bus Rm=0.046 Ω, the following equation is established:

*Rb*+*Rm*=0.069Ω

From above discussions, resistance of the power transistor across two terminals of the lead frame 307 is calculated to be 0.188 Ω.

In FIG. 1B, it is supposed that wire resistance by wire length of each bonding wire 306 is represented by Rb1, Rb2, Rb3, spreading resistance by source side busses 140, 141, 142 is represented by Rb1, Rb2, Rb3, spreading resistance by drain side single bus 150 is represented by Rm1, Rm2, Rm3, and across source-drain resistance of the transistor itself is represented by Rs1, Rs2, Rs3, and that parameters of each of resistance numerical value are designed appropriately.

The following equation is established for resistance of the power transistor across two terminals of the lead frame 307 including each series resistance value of resistance component of each bonding wire 306, element resistance of each power transistor, and bus resistance component:

Resistance of the power transistor across two terminals of the lead frame=

=1/(1/(*Rb*1+*Rn*1+*Rs*1)

+1/(Rb2+Rn2+Rs2)+1/(Rb3+Rn3+Rs3))

+1/(1/(Rb1+Rm1)+1/(Rb2+Rm2)+1/(Rb3+Rm3))

Meanwhile, in the semiconductor integrated circuit shown in FIG. 1B, although explanation is given for a case where three busses 140, 141, 142 are disposed at the source side, the single bus 150 is disposed at drain side, the present embodiment is not limited thereto. For example, same effects are obtainable even if the number of busses at source side is two or four, and it goes without saying that same effects are obtained in such a case where single bus is provided at the source side and three busses are provided at the drain side. In other words, in the present embodiment, it goes without saying that same effects are obtained even if bus arrangement is such one being divided into several portions, nearly upper and lower, nearly right and left, or nearly diagonally, as long as bus arrangement for dividing current pathways of the bus at either source side or drain side is employed.

As explained using FIGS. 1A and 1B, since a plurality of busses (see, for example, busses 130, 131 in FIG. 1A, busses 140, 141, 142 in FIG. 1B) connected to a first electrode (e.g., source electrode) of the power transistor, single bus (see, for example, 150 in FIGS. 1A and 1B) connected to a second electrode (e.g., drain electrode) of the power transistor are included, and a plurality of busses are divided for every one contact pad, it is possible to adjust the area size of a plurality of busses divided while resistance component by wire length of the bonding wire 306 is taken into considerations and is utilized for size design of a plurality of busses. With these features, with the composition shown in FIG. 1A, wire length of the bonding wire 306, size design of power transistors, and bus design can be realized so that current density may become uniform for every power transistor, and equalization of loads of each of power transistors themselves can be attained. Further, with the composition shown in FIG. 1B, wire length of the bonding wire 306, size design of each of power transistors, and bus design can be realized so that it may become uniform for every current pathway, and equalization of loads of each of bonding wires 306 can be attained, and current pathway of each power transistors can be identified. Further, with the composition shown in FIG. 1B, electric current flowing through each power transistor does not cause current crowding even at high current state and flows uniformly to equalize loads applied to the bonding wires 306, metal layer busses, and vias, and consequently current permissible value of the power transistor can be increased as a whole, and reliability can be improved.

Although not shown specifically, with the composition shown in FIG. 1B, in order to realize effects obtained by the composition shown in FIG. 1A, i.e., current density may become uniform for every power transistor, of three busses 140, 141, 142 each having large, medium, small area sizes, respectively, if the positions of busses 140, 142 each having a large area size and a small area size are replaced and the size of busses 140, 142 is fine adjusted, wire length of the bonding wire 306, size design of each power transistor, and bus design can be realized. With these features, electric current flowing through each power transistor does not cause current crowding even at high current state, current is flown in nearly proportion to the size of each power transistor element, equalization of current density can be attained, and equalization of loads to each power transistor, metal layer bus, via can be attained. With these features, current permissible value of the power transistor can be increased as a whole, and reliability can be improved.

Lastly, the positional relationship between the bus, which is a metal layer of the uppermost layer in the aforementioned semiconductor integrated circuit shown in FIGS. 1A and 1B, and two metal layers provided therebelow will be explained. Explanation will be given hereafter referring to the semiconductor integrated circuit shown in FIG. 1A of FIGS. 1A and 1B, while a case where the semiconductor integrated circuit shown in FIG. 1B is used will be easily understood from the following explanation.

Figure 2:
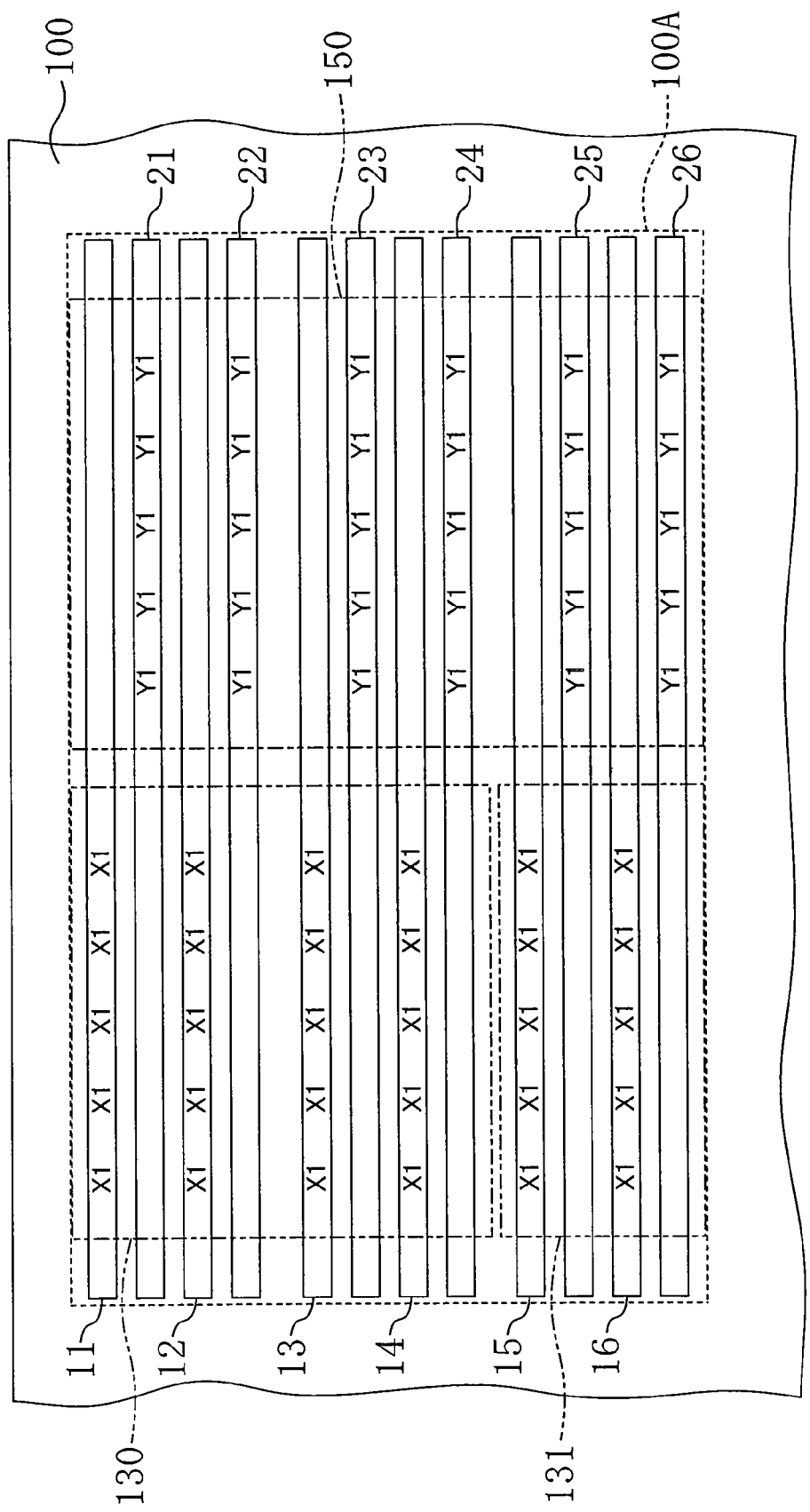
FIG. 2 is a simplified plan view showing schematically a part of IC chip, which is an important part of the semiconductor integrated circuit relating to the first embodiment of the present invention, and shows arrangement relationship between a bus metal layer (third layer bus) divided into a plurality of busses and a bus metal layer (third layer bus) serving as single bus, a metal layer (second layer bus) serving as a line for source electrode and drain electrode one lower layer thereof, and via.
Figure 3:
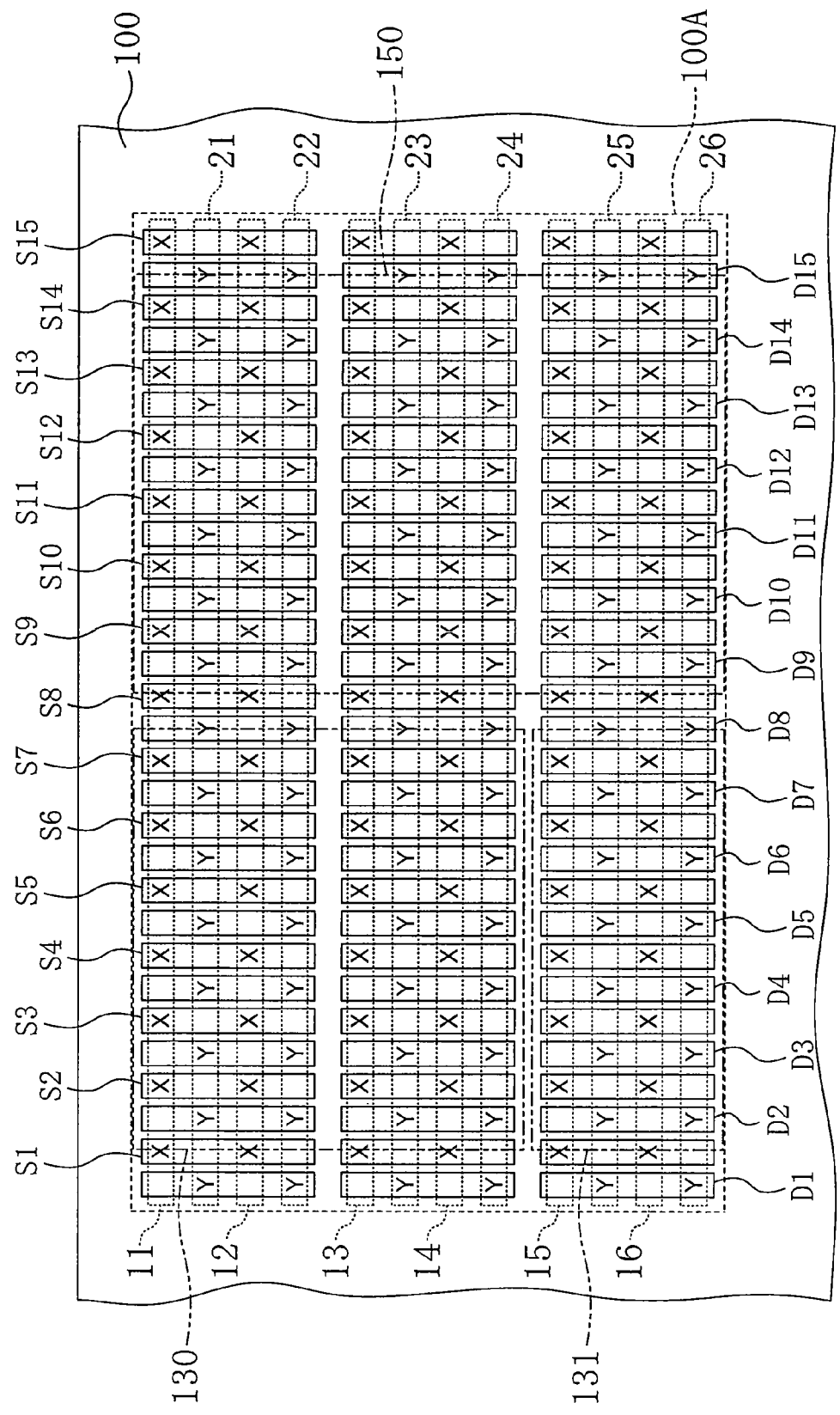
FIG. 3 is a simplified plan view showing schematically a part of IC chip, which is an important part of the semiconductor integrated circuit relating to the first embodiment of the present invention, and shows arrangement relationship between a bus metal layer (third layer bus) divided into a plurality of busses and a bus metal layer (third layer bus) serving as single bus, a metal layer (second layer bus) serving as a line for source electrode and drain electrode one lower layer thereof, a metal layer (first layer bus) serving as source electrode and drain electrode further one lower layer thereof, and via.

FIGS. 2 and 3 are plan view schematically showing positional relationship with regard to the metal layer at lower side of busses 130, 131, 150 shown in FIG. 1A. In FIG. 2 and FIG. 3, each of busses 130, 131, 150 is shown in perspective fashion, and in FIG. 3, the second layer busses are shown in perspective fashion.

First, as shown in FIG. 2, at lower side of busses 130, 131, 150 which serve as the third layer in the present embodiment, metal layers 11, 12, 13, 14, 15, 16 of the source line (first metal pattern) as the second layer bus (second metal layer), and metal layers 21, 22, 23, 24, 25, 26 of the drain line (second metal pattern) as the second layer bus are formed alternately so that they have elongated lateral direction stripe profile and are parallel to each other with a constant pitch. Third layer busses 130, 131 are connected to source lines 11 and 12, 13 and 14, 15 and 16, respectively which serve as the second layer bus through a plurality of vias X1 to which metal is filled; a third layer buss 150 is connected to drain lines 21 and 22, 23 and 24, 25 and 26, respectively through a plurality of vias Y1 to which metal is filled.

Further, as shown in FIG. 3, at lower side of metal layers 11-16, 21-26 of the source line and the drain line as the second layer bus, metal layers S1-S15 of source electrode line (first metal pattern) as the first layer bus (first metal layer) and metal layers D1-D15 of drain electrode line (second metal pattern) as the first layer bus are formed alternately so that they run in a direction perpendicular to these second layer busses, have elongated vertical direction stripe profile and are parallel to each other with a constant pitch. Metal layers S1-S15 of the source electrode line of the first layer bus are electrically connected to source lines 11-16, each of which is a second layer bus, respectively, through a plurality of vias X to which metal is filled, metal layers D1-D15 of drain electrode line of the first layer bus are electrically connected to drain lines 21-26, which is a second layer bus, respectively, through a plurality of vias Y to which metal is filled. Meanwhile, FIG. 1 through FIG. 3 are primarily for explanation of positional relationships between first layer busses through third layer busses, vias, contact pads, and bonding wires formed on a semiconductor substrate, and interlayer insulation films (not shown) (e.g., see FIG. 4 which will be dealt with later) formed between each of busses, openings and other concrete compositions will be explained using concrete examples shown in FIG. 4.

Figure 4:
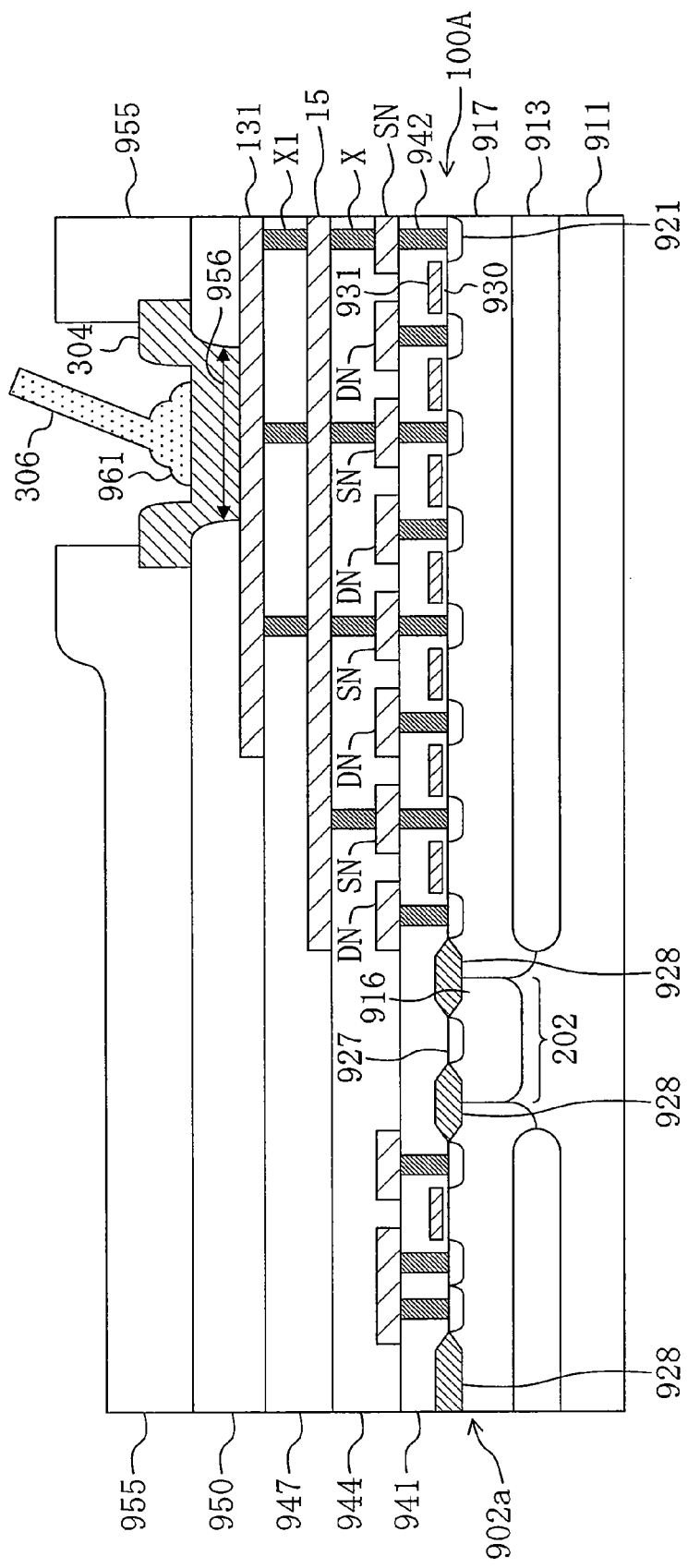
FIG. 4 is a sectional view corresponding to IV-IV line in FIG. 1A which is an important part of the semiconductor integrated circuit relating to the first embodiment of the present invention.

Here, FIG. 4 is a sectional view corresponding to line IV-IV in FIG. 1A and shows a part of sectional composition of the semiconductor integrated circuit relating to the present embodiment.

As shown in FIG. 4, a power transistor 100A and a periphery element (CMOS transistor) 902a are formed on a p-type silicon substrate 911. In a region where the power transistor 100A is formed, on a p-type silicon substrate 911 are formed an n-type buried region 913, an n-type well region 917, a source/drain contact region 921, a gate oxide 930, and a polysilicon gate 931. A first interlevel insulator layer 941 is formed so as to cover these members, and a first via 942 reaching to the source/drain contact region 921 is formed in the first interlevel insulator layer 941. On the first interlevel insulator layer 941, a line (first layer bus) SN for the source electrode comprising metal layer and a line (first layer bus) DN for the drain electrode are formed, a second interlevel insulator layer 944 is formed so as to cover the line SN for source electrode and the line DN for drain electrode, and a second vias X to be connected to the line SN for source electrode is formed in the second interlevel insulator layer 944. Meanwhile, although not shown, vias to be connected to the line DN for drain electrode is formed similarly in the second interlevel insulator layer 944. On the second interlevel insulator layer 944 are formed source line (second layer bus) comprised of a metal layer (drain line (second layer bus) is formed similarly on the section not shown), a third interlevel insulator layer 947 covering the source line 15 and a drain line (not shown), and in the third interlevel insulator layer 947 is formed a third vias X1 to be connected to the source line 15 (vias to be connected to the drain line are formed similarly on the section not shown). On the third interlevel insulator layer 947 are formed the third layer bus 131 comprised of a metal layer and a fourth interlevel insulator layer 950 which covers the bus 131 and has an opening 956. A contact pad 304 is formed to the opening 956, a protective covering layer 955 which exposes the contact pad 304 is formed on the fourth interlevel insulator layer 950, and a ball 961 and the bonding wire 306 are formed to the contact pad 304.

Further, on the p-type silicon substrate 911 are further formed the n-type buried region 913 and the n-type well region 917 at the opposed side of the region where the power transistor 100A is formed via a p-type well region 916 having a substrate region 927 and an element separation insulator layer 202, and the periphery element 902a is formed on the region 917. Meanwhile, the power transistor 100A and the periphery element 902a are electrically separated by the element separation insulator layer 202.

As explained above, the semiconductor integrated circuit relating to the first embodiment of the present invention comprises a plurality of busses (e.g., busses 130, 131, see FIG. 1A or busses 140, 141, 142, see FIG. 1B) connected to a first electrode (e.g., source electrode) of the power transistor, and single bus (e.g., 150, see FIGS. 1A and 1B) connected to a second electrode (e.g., drain electrode) of the power transistor, each bus is connected to corresponding electrode by vias filled with metal, these busses are disposed immediately above the power transistor, and one contact pad is connected for every bus. With these features, it is now possible to divide current pathways of the power transistor, to identify current routes leading to each power transistor, to connect a plurality of contact pads to a single bus and to cause a plurality of busses to have sizes a different or same area for optimization of currents flowing through each power transistor and for optimization of currents flowing through each bonding wire, thereby obtaining aforementioned effects.

Second Embodiment

Referring now to the drawings, the semiconductor integrated circuit relating to a second embodiment of the present invention and manufacturing method thereof will be explained hereafter.

FIG. 5 and aforementioned FIG. 1A show simplified plan view of a part of the semiconductor integrated circuit relating to the second embodiment of the present invention together with electric diagram.

Common features shared by the semiconductor integrated circuit shown in FIG. 5 and aforementioned FIG. 1B are such that there are provided a plurality of busses divided and single bus, the area of a plurality of busses is different from each other, and each area is gradually increased from those closer to the lead frame to those away therefrom. The composition of the semiconductor integrated circuit shown in FIG. 1B is same as those explained in the first embodiment and therefore, the following description will deal with the composition of the semiconductor integrated circuit shown in FIG. 5, while explanation of those identical with those explained in the first embodiment will be omitted.

The semiconductor integrated circuit shown in FIG. 5 is different from the composition of the semiconductor integrated circuit shown in FIG. 1A in that size of area of a plurality of busses, two busses 130, 131 is opposite. Other composition and lower composition not shown in FIG. 5 are same as those shown in the explanation using aforementioned FIG. 1A and are easily assumed from the explanation using FIG. 2 and FIG. 3, and therefore their explanation will be omitted.

The semiconductor integrated circuit relating to the present embodiment having the structure shown in FIG. 5 has electrical features shown in the electric diagram at lower part of FIG. 5.

In other words, the electric diagram shown at lower part of FIG. 5 schematically shows electrical features relating to power transistor operations caused by that the connecting members are disposed while being separated from the lead frames 307. In the electric diagram, three resistances by the bonding wires 306 are represented by $Ra1$, $Ra2$, $Ra3$, and of them, $Ra1$, $Ra2$ are connected in parallel with the lead frame 307. In two busses 130, 131 and the single bus 150, resistances with regard to electric current flowing through these busses are spreading resistance of the busses, and bus resistances are represented by $Rh1$, $Rh2$, $Rh3$, and across source-drain resistances of two transistors themselves are represented by $Rs1$, $Rs2$.

As shown in FIG. 5, in the electric diagram looking from the lead frame 307, bus resistances $Rh1$, $Rh2$ are connected in series to each of wire resistances $Ra1$, $Ra2$ of two bonding wires 306 connected in parallel to the lead frame 307 and are further connected to one side of across source-drain resistances $Rs1$, $Rs2$ of the transistor itself. Other side of across source-drain resistances $Rs1$, $Rs2$ of the transistor itself is short-circuited by the single bus 150, connected to wire resistance $Ra3$ of one bonding wire 306, and is connected to the lead frame 307 to form a resistance circuit.

Meanwhile, the semiconductor integrated circuits shown in FIG. 5 and FIG. 1B are active circuits, and here, active circuits denotes various electric parts which provide functionality to ICs. In particular, as used herein, the active circuit denotes a metal layer which serves as a power bus of power transistors disposed in lateral direction.

Differences between the aforementioned semiconductor integrated circuit shown in FIG. 1B and the semiconductor integrated circuit shown in FIG. 5 are as follows: Namely, due to that a plurality of contact pads 304 are connected to the single bus 150, increased number of bonding wires 306 results in increase in the allowable current value. This eliminates restrictions on the bonding wire 306 at high current state, the resistance component of the bonding wire 306, of whole resistance of the power transistor, can be reduced, and therefore, the current pathway leading to each power transistor can be identified while lowering of power transistor resistance is attempted. This allows optimization of the electric current flowing through each power transistor and it is possible to further improve the allowable current value of the power transistor as a whole.

Further, as it is apparent from comparison between the electric circuits shown in FIG. 5 and FIG. 1B and the electric circuit shown in FIG. 13 which is explained in the prior art, with conventional example, a plurality of contact pads are connected commonly to a metal layer bus of the uppermost layer and hence one current pathway is used for the power transistors themselves, while in the present embodiment, two busses 130, 131 are provided so as to be corresponding to each of two contact pads 304 so that one bus is provided to one contact pad (see FIG. 5), or three busses 140, 141, 142 are provided so as to be corresponding to each of three contact pads 304 (see FIG. 1B), the power transistor is divided into two or three, and hence current pathway of the power transistor is divided into two or three. With these features, current route leading to each transistor can be identified and at the same time, optimization of electric current flowing through each power transistor can be attained, while damage to the power transistor due to current crowding and stress are prevented. Accordingly, allowable current value of the power transistor can be increased as a whole, and a semiconductor integrated circuit with excellent reliability can be realized.

Further, if a large bus area is divided into appropriate size and the contact pad 304 is disposed to each of two busses 131, 132 (see FIG. 5) or three busses 140, 141, 142 (see FIG. 1B), such effects are obtained that current pathway is divided and damage to the power transistor due to unforeseen current crowding is prevented.

As for bus layout, although FIG. 5 and FIG. 1B illustrate a plurality of busses disposed upper and lower (busses 131, 132 in FIG. 5, busses 140, 141, 142 in FIG. 1B), same effects are obtainable with bus arrangement for dividing the current pathway nearly upper and lower, nearly right and left, or nearly diagonally.

According to the composition shown in FIG. 5, it is possible to take resistance components by wire length of the bonding wires 306 into considerations and utilize it in size designing of two busses 130, 131 at source side, and to adjust the each area size of busses 130, 131 divided at source side. With this feature, wire length of the bonding wires 306, size design of each power transistor, and bus design can be realized so that combined resistance value of resistance component of each bonding wire 306 looking from the lead frame 307, element resistance of each power transistor, and bus resistance component may become uniform for each current pathway, and current pathway leading to the power transistor element itself can be identified.

Using a concrete example, effects by the aforementioned semiconductor integrated circuit shown in FIG. 5 will be explained hereafter.

For example, suppose that resistance value per unit length of the bonding wire 306 is designed to be 50 mΩ/mm, and if wire length of each of the bonding wires 306 connected to the source side is designed to be 1 mm, 2 mm, and wire length of each of bonding wires 306 connected to the drain side is designed to be 1.5 mm. In this case, it is supposed that three resistances by wire length of each of bonding wires 306 can be designed to be $Ra1=0.05\ \Omega$, $Ra2=0.1\ \Omega$, $Ra3=0.75\ \Omega$, spreading resistance of two busses at source side can be designed to be $Rh1=0.13\ \Omega$, $Rh2=0.105\ \Omega$, total of spreading resistance of one bus at drain side can be designed to be $Rh3=0.058\ \Omega$ considering one contact pad 304, and across source-drain resistance of the transistor itself can be designed to be $Rs1=0.125\ \Omega$, $Rs2=0.1\ \Omega$. With this assumption, resistance value from the bonding wire 306 connected to the source side of the power transistor till the drain side of the power transistor element itself can be represented approximately by the following equation, if expressed by each of series resistance values of resistance component of each of bonding wires 306, element resistance of each of power transistor elements, bus resistance component at source side.

$$Ra1+Rh1+Rs1$$

$$=Ra2+Rh2+Rs2=0.305\Omega$$

Further, resistance value from the single bus 150 connected to the drain side of the power transistor element itself till the bonding wire 306 connected to the lead frame 307 can be represented approximately by the following equation, if expressed by each of series resistance values of resistance component of each of bonding wires 306, element resistance of each of power transistor elements, bus resistance component at source side.

$$Ra3+Rh3=0.133\Omega$$

From above discussions, resistance of the power transistor across two terminals of the lead frame 307 is calculated to be 1.286 Ω.

In FIG. 5, wire resistances by wire length of each of bonding wires 306 are represented by $Ra1$, $Ra2$, $Ra3$, spreading resistances by busses 130, 131 at the source side are represented by $Rh1$, $Rh2$, spreading resistance by the single bus 150 at the drain side is represented by $Rh3$, and across source-drain resistances of the transistor itself are represented by $Rs1$, $Rs2$, and parameters of numerical values of each resistance are designed appropriately.

For resistance of the power transistor across two terminals of the lead frame 307 including each of series resistance values of resistance component of each of bonding wires 306, element resistance of each of power transistor elements, and resistance component of each of busses is expressed by the following equation:

Resistance of power transistor across two terminals of the lead frame=

$$=1/(1/(Ra1+Rh1+Rs1)$$

$$+1/(Ra2+Rh2+Rs2))+Ra3+Rh3$$

For the aforementioned semiconductor integrated circuit shown in FIG. 5, although explanation is given for the composition where two busses 130, 131 are disposed at the source aide and the single bus 150 is disposed at the drain side, the present embodiment is not limited thereto. For example, the same effects are obtained even if the number of busses at the source side is three, or four, or the like, and it goes without saying that the same effects are obtained even if the source side comprises single bus and the drain side comprises two busses. Namely, it goes without saying that the same effects are obtained even if bus arrangement for dividing current pathway of the bus of either source side or drain side is such one being divided into several members nearly upper and lower, nearly right and left, or nearly diagonally.

As explained referring to FIG. 5 and FIG. 1B, the semiconductor integrated circuit comprises a plurality of busses (e.g., busses 130, 131, see FIG. 5, busses 140, 141, 142, see FIG. 1B) connected to the first electrode (e.g., source electrode) of the power transistor, single bus (e.g., 150, see FIG. 5 and FIG. 1B) connected to the second electrode (e.g., drain electrode) of the power transistor, and each of a plurality of busses is divided for every one contact pad, and it is possible to take resistance component by wire length of the bonding wire 306 into consideration, to utilize it in size design of a plurality of busses so as to adjust the area size of a plurality of busses divided. With these features, since resistance value of a current pathway of each power transistor is divided uniformly, electric current flowing through each of power transistor itself divided becomes uniform, and the current pathway can be identified. Particularly, in FIG. 5, currents flowing through each of power transistors do not cause current crowding even at high current state and flow uniformly to equalize loads applied to the bonding wires 306, metal layer busses and vias, and consequently allowable current value of the power transistor can be increased as a whole, and improvement of reliability can attained.

Third Embodiment

Referring now to the drawings, the semiconductor integrated circuit relating to a third embodiment of the present invention and manufacturing method thereof will be explained hereafter.

FIGS. 6A and 6B are simplified plan views showing a part of the semiconductor integrated circuit relating the third embodiment of the present invention. Common features of the semiconductor integrated circuit shown in FIGS. 6A and 6B are that it comprises a plurality of busses divided and single bus, and that the area of a plurality of busses is the same. In the following description, for the composition of the semiconductor integrated circuit shown in FIGS. 6A and 6B, explanation of those identical with those explained in the first embodiment will be omitted.

In the semiconductor integrated circuit shown in FIG. 6A, two busses 130, 131 connected to the source electrode and having the same area are provided, one contact pad 304 is disposed to each of busses 130, 131, and one contact pad 304 is disposed to the single bus 150 connected to the drain electrode.

Here, effects by the aforementioned semiconductor integrated circuit shown in FIG. 6A will be explained hereafter using a concrete example.

For example, if spreading resistance of two busses 130, 131 at the source side are designed to be Rh1=0.116 Ω, Rh2=0.116 Ω, across source-drain resistance of the transistor itself are designed to be Rs1=0.11 Ω, Rs2=0.11 Ω, the following equation is established for each of series resistance value of element resistance of each power transistor and bus resistance component:

Rh1+Rs1

=$Rh2+Rs2$=0.226Ω

In the meantime, in the semiconductor integrated circuit shown in FIG. 6B, three busses 140, 141, 142 connected to the source electrode and having the same area are provided, one contact pad 304 is disposed to each of busses 140, 141, 142, and three contact pads 304 are disposed to the single bus 150 connected to the drain electrode so that they may be bilaterally-symmetric with the contact pads 304 provided to each of busses 140, 141, 142.

Here, effects by the aforementioned semiconductor integrated circuit shown in FIG. 6B will be explained hereafter using a concrete example.

For example, when spreading resistances of three busses 140, 141, 142 at the source side are designed to be Rh1=0.14 Ω, Rn2=0.14 Ω, Rn3=0.14 Ω, across source-drain resistance of the transistor itself are designed to be Rs1=0.14 Ω, Rs2=0.14 Ω, Rs3=0.14 Ω, the following equation is established for each series resistance value of resistance value of element resistance of each power transistor, and each bus resistance component:

Rn1+Rs1

=$Rn2+Rs2$

=$Rn3+Rs3$=0.28Ω

Further, in FIGS. 6A and 6B, a plurality of busses (two busses 130, 131 in FIG. 6A, three busses 140, 141, 142 in FIG. 6B) are divided so as to have an identical area, damage by ESD of metal layer of large size bus can be reduced. In other words, since a plurality of busses at the source side from the lead frame 307 are divided uniformly, when ESD energy is applied via the bonding wires 306, a peak value of ESD energy applied to each of power transistor elements having evenly divided resistance component acts in that ESD energy is distributed in similar fashion as divided case. For this reason, ESD proof strength of the power transistor determined by peak value of ESD energy is improved and reliability of the semiconductor integrated circuit is improved.

Further, there are different portions in the composition shown in FIGS. 6A and 6B, and therefore, effects about ESD become different. With the composition shown in FIG. 6B, three contact pads 304 are provided to the single bus 150 at the drain side, and are connected to a plurality of bonding wires 306. If compared to the composition shown in FIG. 6A, combined impedance including resistance component by two busses 130, 131 at the drain side and by the bonding wire 306 is reduced, and this composition will be easily damaged by ESD.

For the semiconductor integrated circuit shown in FIG. 6A, although explanation is given for a case where two busses 130, 131 are disposed to the source side and single bus 150 is disposed to the drain side, the present embodiment is not limited thereto. For example, the same effects are obtained even if the number of busses at the source side is three, or four, or the like, and it goes without saying that the same effects are obtained even if the source side comprises single bus and the drain side comprises two busses. Namely, it goes without saying that, in the present embodiment, the same effects are obtained even if bus arrangement for dividing current pathway of the bus of either source side or drain side is such one being divided into several members nearly upper and lower, nearly right and left, or nearly diagonally. Above-mentioned matters are applicable to the semiconductor integrated circuit shown in FIG. 6B.

Fourth Embodiment

Referring now to the drawings, the semiconductor integrated circuit relating to a fourth embodiment of the present invention and manufacturing method thereof will be explained.

In the fourth embodiment, first through third modified examples applicable to the semiconductor integrated circuit relating to the aforementioned first through third embodiments will be explained. For the first through the third modified examples, explanation will be given using, for example, the semiconductor integrated circuit shown in FIGS. 6A and 6B, i.e., a semiconductor integrated circuit with composition in which a plurality of busses are divided to have an identical area.

First Modified Example

The first modified example shown in FIGS. 7A and 7B is characterized in that the active region of the power transistor is electrically separated by a separating layer.

In particular, in FIG. 7A, active region of the power transistor is divided into two active regions 100a1, 100a2 and this is different from the semiconductor integrated circuit shown in FIG. 6A in that two power transistors electrically separated from each other by a separating layer are formed to two active regions 100a1, 100a2. Other compositions are identical with the semiconductor integrated circuits shown in FIG. 6A, sectional view at IV-IV line of FIG. 7A is identical with FIG. 4, and as mentioned above, active region of the power transistor and the periphery element are electrically separated by a separating layer.

In FIG. 7B, the active region of the power transistor is divided into three active regions 100a1, 100a2, 100a3, and this is different from the semiconductor integrated circuit shown in FIG. 6B in that three power transistors electrically separated by a separating layer are formed to three active regions 100a1, 100a2, 100a3. Other compositions are identical with the semiconductor integrated circuits shown in FIG. 6B.

In this way, by that the power transistor is divided by a separating layer corresponding to a plurality of busses (busses 130, 131 in FIG. 7A, busses 140, 141, 142 in FIG. 7B) connected to the source electrode, the power transistor having one contact pad 304 distributed on each of a plurality of aforementioned busses to be connected to the source electrode is enclosed by the separating layer. For this reason, erroneous operations such as latch and parasitism hardly occur and reliability is further improved.

Second Modified Example

The second modified example shown in FIGS. 8A and 8B is characterized in that a contact pad formed to the bus farthest away from the lead frame side is formed so that it is protruded in part.

The second modified example shown in FIGS. 8A and 8B is different from the semiconductor integrated circuit shown in FIGS. 6A and 6B in that the active region 100B of the power transistor is narrow as shown in FIGS. 8A and 8B and when the area of each bus formed thereon (busses 130, 131, 150 in FIG. 8A, busses 140, 141, 142, 150 in FIG. 8B) is small, bus located farthest away from the lead frame 307 (contact pad 304 formed to bus 130 in FIG. 8A, contact pad 304 formed to bus 142 in FIG. 8B, and contact pad 304 formed to the bus 150 located bilaterally-symmetric therewith) is formed so that it is protruded in part. Other compositions are identical with the semiconductor integrated circuits shown in FIGS. 6A and 6B.

With these features, contact of the bonding wires 306 themselves is prevented and short-circuiting across outputs is prevented. Accordingly, effects obtained by aforementioned first through third embodiments can be obtained while connecting appropriately the bonding wire 306 to the lead frame 307.

Further, valuable silicon resources can be saved in the semiconductor integrated circuit through array of the power supplying contact pad 304 distributed on the power transistor, a means for supplying primarily vertical direction current from the contact pad 304 to the power transistor with distributed manner, and arrangement of power supplying contact pad 304 immediately above the power transistor including a means for connecting a power supply to each contact pad 304. Namely, IC chip costs can be reduced by reducing the chip area consumed by the contact pad 304. As mentioned, the area of the IC chip can be saved and at the same time, cost reduction of the IC chip is realized. In this regard, as far as effects of saving of chip area are concerned, the composition of aforementioned first through third embodiments is superior to the composition of this second modified example.

Third Modified Example

Figure 9A:
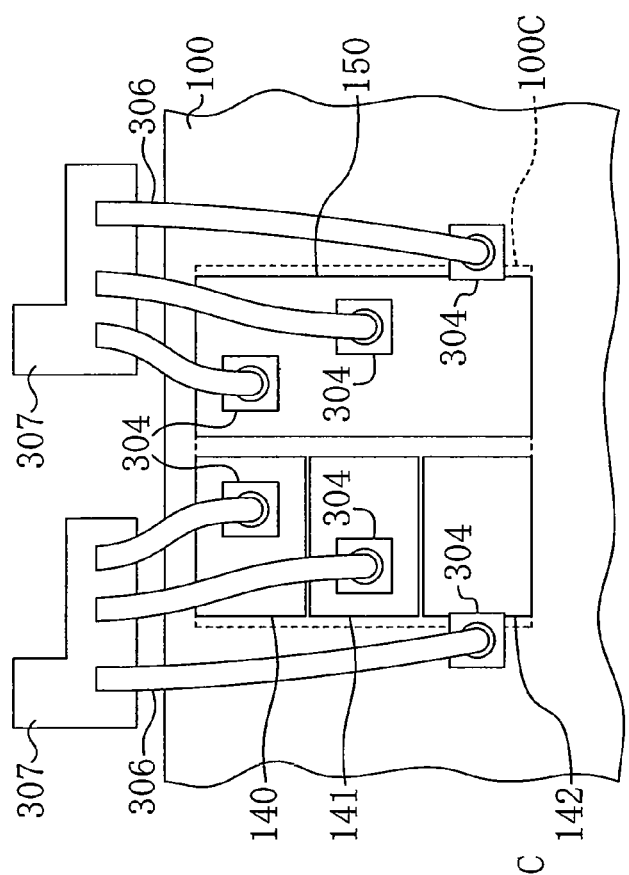
FIG. 9A is a simplified plan view showing schematically a part of IC chip, which is an important part of a third modified example of the semiconductor integrated circuit relating to the third embodiment of the present invention and has a bus metal layer divided into a plurality of busses, bus a metal layer serving as single bus, and has such a composition that one contact pad is disposed on each of busses, and some of the contact pads immediately above the device are protruded entirely from the busses immediately below.
Figure 9B:
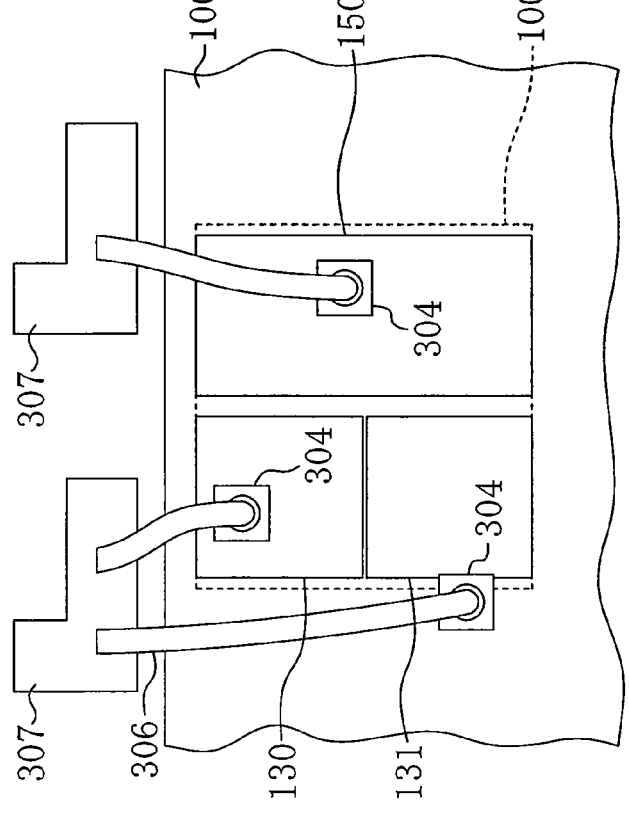
FIG. 9B is a simplified plan view showing schematically a part of IC chip, which is an important part of the third modified example of the semiconductor integrated circuit relating to the third embodiment of the present invention and has a bus metal layer divided into a plurality of busses, a bus metal layer serving as single bus, and has such a composition that one contact pad is disposed on each of a plurality of busses, a plurality of contact pads are disposed on the single bus, and some of the contact pads immediately above the device are protruded entirely from the busses immediately below.

The third modified example shown in FIGS. 9A and 9B is characterized in that a contact pad formed to the bus farthest away from the lead frame side is formed so that it is protruded entirely.

The third modified example shown in FIGS. 9A and 9B is different from the semiconductor integrated circuit shown in FIGS. 6A and 6B in that the active region 100C of the power transistor is narrow as shown in FIGS. 9A and 9B and when the area of each bus formed thereon (busses 130, 131, 150 in FIG. 9A, busses 140, 141, 142, 150 in FIG. 9B) is small, bus located farthest away from the lead frame 307 side (contact pad 304 formed to bus 130 in FIG. 9A, contact pad 304 formed to bus 142 in FIG. 9B, and contact pad 304 formed to the bus 150 located bilaterally-symmetric therewith) is formed so that it is protruded in part. Other compositions are identical with the semiconductor integrated circuits shown in FIGS. 6A and 6B.

With these features, contact of the bonding wires 306 themselves is prevented and short-circuiting across outputs is prevented. Accordingly, effects obtained by aforementioned first through third embodiments can be obtained while connecting appropriately the bonding wire 306 to the lead frame 307.

Further, valuable silicon resources can be saved in the semiconductor integrated circuit through array of the power supplying contact pad 304 distributed on the power transistor, a means for supplying primarily vertical direction current from the contact pad 304 to the power transistor with distributed manner, and arrangement of power supplying contact pad 304 immediately above the power transistor including a means for connecting a power supply to each contact pad 304. Namely, IC chip costs can be reduced by reducing the chip area consumed by the contact pad 304. As mentioned, the area of the IC chip can be saved and at the same time, cost reduction of the IC chip is realized. In this regard, as far as effects of saving of chip area are concerned, the composition of aforementioned first through third embodiments is superior to the composition of this third modified example.

Fifth Embodiment

Referring now to the drawings, the semiconductor integrated circuit relating to a fifth embodiment of the present invention will be explained.

In this embodiment, a composition commonly characteristic to each of the aforementioned first through fourth embodiments, i.e., a composition including a plurality of divided busses and single bus, will be explained referring to an example applied practically.

Figure 10A:
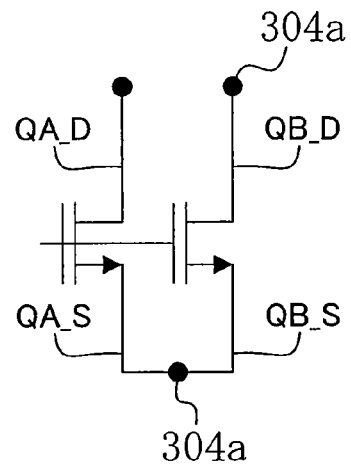
FIGS. 10A through 10C are image drawing showing that, in a fourth embodiment of the present invention, Pch power transistors divided into two or Nch power transistors divided into two compose output circuits divided into two, contact pads to be used for two divided output circuits are connected to leads of a package.
Figure 10B:
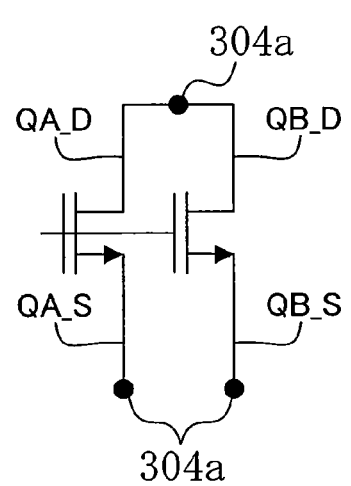
Figure 10C:
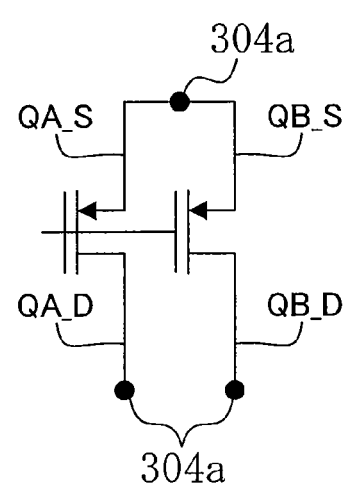

FIGS. 10A-10C are examples of simplified equivalent electric diagrams illustrating the power transistor element part depicted in FIG. 1 in the aforementioned first embodiment.

In FIG. 10A, a simplified equivalent electric diagram for Nch-power transistor is shown.

As shown in FIG. 10A, the drain side of Nch-power transistor is divided by bus into two, and one contact pad (shown by black circle in the drawing) is provided to each of drain outlets QA_D, QB_D. The source side of Nch-power transistor is connected by one bus, source outlet QA_S, QB_S become common, and have one contact pad 304a.

In FIG. 10B, a simplified equivalent electric diagram for Nch-power transistor is shown.

As shown in FIG. 10B, the source side of Nch-power transistor is divided by bus into two, and one contact pad 304a is provided to each of source outlets QA_S, QB_S. The drain side of Nch-power transistor is connected by one bus, drain outlet QA_D, QB_D become common, and have one contact pad 304a.

In FIG. 10C, a simplified equivalent electric diagram for Pch-power transistor is shown.

As shown in FIG. 10C, the drain side of Pch-power transistor is divided by bus into two, and one contact pad 304a is provided to each of drain outlets QA_D, QB_D. The source side of Pch-power transistor is connected by one bus, source outlets QA_S, QB_S become common, and have one contact pad 304a.

Figure 11A:
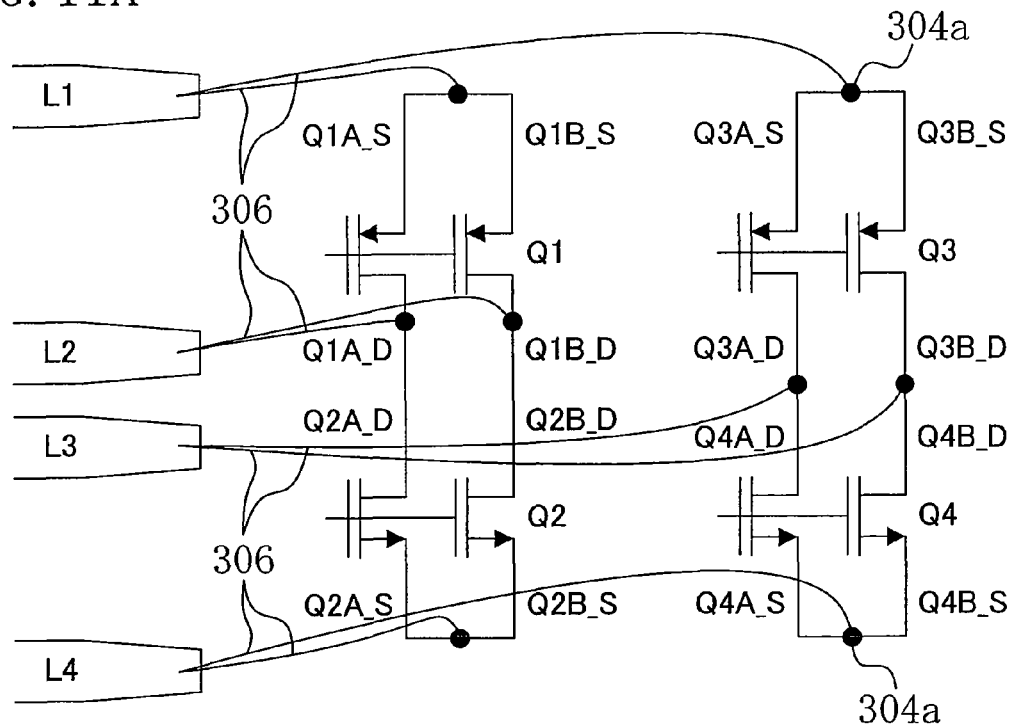
FIGS. 11A and 11B are image drawing showing that, in the fourth embodiment of the present invention, two Pch power transistors and two Nch power transistors, or four Nch power transistors compose two output circuits, contact pads to be used for two output circuits are connected to the leads of the package.
Figure 11B:
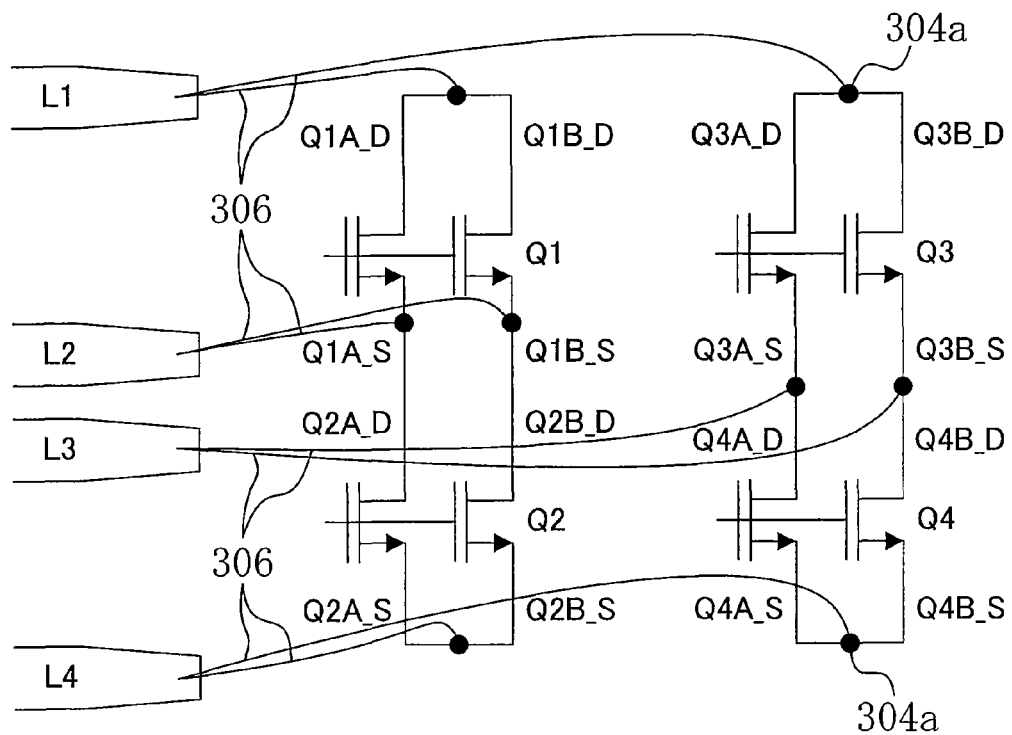

FIGS. 11A and 11B are simplified equivalent electric diagrams for the output circuit using the aforementioned power transistor in FIG. 10A-10C.

In FIG. 11A, an equivalent electric diagram is shown where a plurality of power transistors are composed as the output circuit using equivalent electric circuits shown in FIGS. 10A and 10B.

As shown in FIG. 11A, the source side of Pch-power transistor Q1 (Q1A_S, Q1B_S) is connected commonly by a bus, and is connected to the lead frame L1 by the bonding wire 306 via one contact pad 304a. Similarly, the source side of Nch-power transistor Q3 (Q3A_S, Q3B_S) is connected commonly by a bus, and is connected to the lead frame L1 by the bonding wire 306 via one contact pad 304a.

Further, source side of Nch-power transistor Q2 (Q2A_S, Q2B_S) is connected commonly by a bus, and is connected to the lead frame L4 by the bonding wire 306 via one contact pad 304a. Similarly, the source side of Pch-power transistor Q4 (Q4A_S, Q4B_S) is connected commonly by a bus, and is connected to the lead frame L4 by the bonding wire 306 via one contact pad 304a.

Further, the drain side of Pch-power transistor Q1 (QIA_D, QIB_D) is connected by two busses to the drain side of N-ch power transistor Q2 (Q2A_D, Q2B_D), and one contact pad 304a is provided to each of two busses. Namely, two drain outputs of Pch-power transistor and two drain outputs of Nch-power transistor are connected commonly by two busses, and are connected to the lead frame L2 by the bonding wires 306 via two contact pads 304a.

Further, the drain side of Pch-power transistor Q3 (Q3A_D, Q3B_D) is connected by two busses to the drain side of N-ch power transistor Q4 (Q4A_D, Q4B_D), and one contact pad 304a is provided to each of two busses. Namely, two drain outputs of Pch-power transistor and two drain outputs of Nch-power transistor are connected commonly by two busses, and are connected to the lead frame L3 by the bonding wires via two contact pads.

In the meantime, as an example of a composition different from the composition shown in FIG. 11A, an equivalent electric circuit, where a plurality of power transistors are composed as the output circuit using equivalent electric circuit of the power transistor shown in FIGS. 10A and 10B, is shown in FIG. 11B.

As shown in FIG. 11B, the drain side of Nch-power transistor Q1 (Q1A_D, Q1B_D) is connected commonly by a bus, and is connected to the lead frame L1 by the bonding wire 306 via one contact pad 304a. Similarly, the drain side of Nch-power transistor Q3 (Q3A_S, Q3B_S) is connected commonly by a bus, and is connected to the lead frame L1 by the bonding wire 306 via one contact pad 304a.

Further, the source side of Nch-power transistor Q2 (Q2A_S, Q2B_S) is connected commonly by a bus, and is connected to the lead frame L4 by the bonding wire 306 via one contact pad 304a. Similarly, the source side of Nch-power transistor Q4 (Q4A_S, Q4B_S) is connected commonly by a bus, and is connected to the lead frame L4 by the bonding wire 306 via one contact pad 304a.

Further, the source side of Nch-power transistor Q1 (Q1A_S, Q1B_S) is connected by two busses to the drain side of N-ch power transistor Q2 (Q2A_D, Q2B_D), and one contact pad 304a is provided to each of two busses. Namely, two source outputs of Nch-power transistor and two drain outputs of Nch-power transistor are connected commonly by two busses, and are connected to the lead frame L2 by the bonding wire 306 via two contact pads 304a.

Further, the source side of Nch-power transistor Q3 (Q3A_S, Q3B_S) is connected by two busses to the drain side of N-ch power transistor Q4 (Q4A_D, Q4B_D), and one contact pad 304a is provided to each of two busses. Namely, two source outputs of Nch-power transistor and two drain outputs of Nch-power transistor are connected commonly by two busses, and are connected to the lead frame L3 by the bonding wires 306 via two contact pads 304a.

Figure 12:
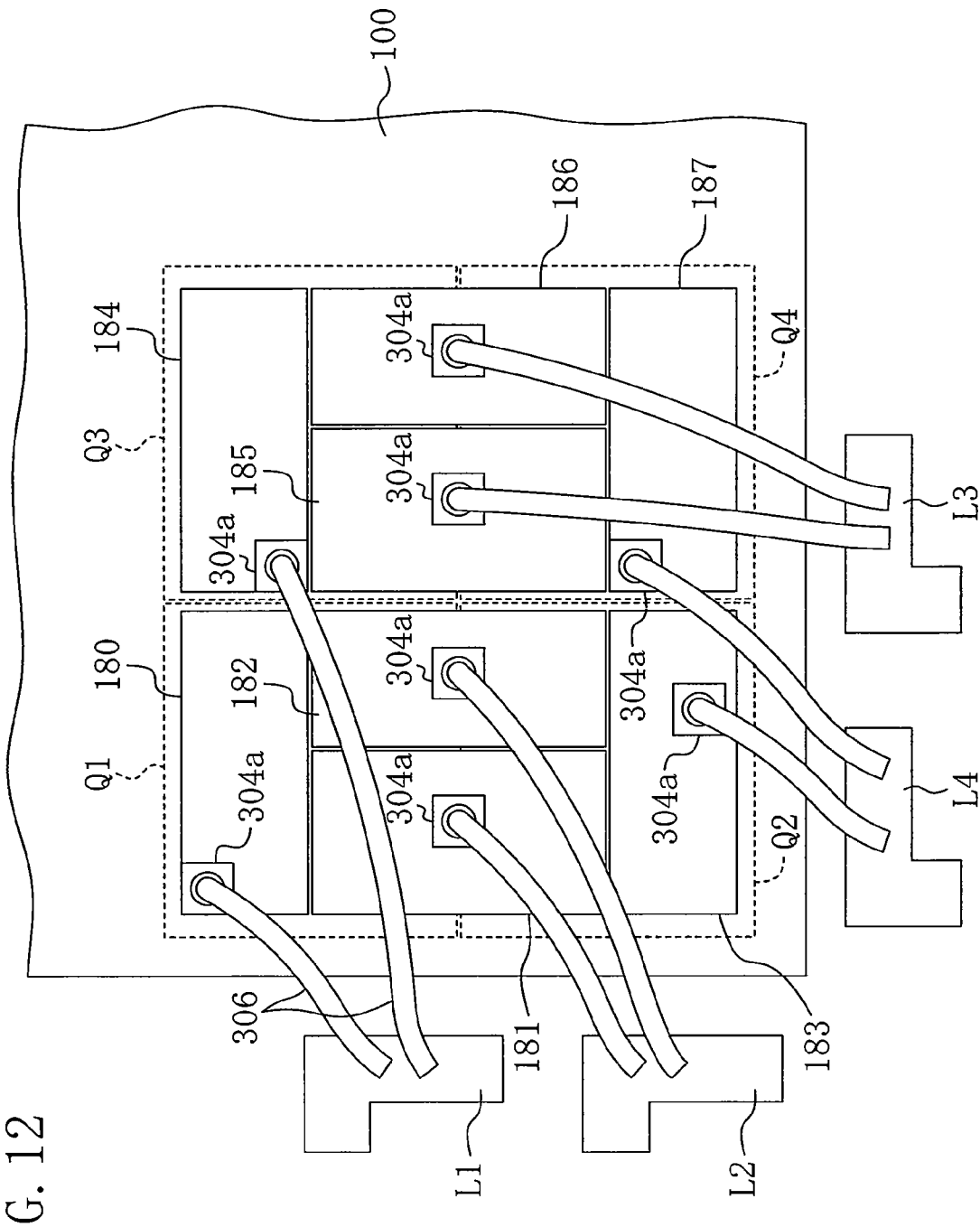
FIG. 12 is a simplified plan view showing schematically a part of IC chip, and is related to FIG. 10 and FIG. 11, in the fourth embodiment of the present invention where four power transistors compose two output circuits, and layout of four power transistors is drawn to connect contact pads to be used for the output circuits to the leads of the package.

FIG. 12 shows aforementioned simplified equivalent electric circuits shown in FIGS. 11A and 11B in the form of a simplified plan view of a part of the equivalent IC chip 100. In the following description, explanation will be given considering that FIG. 12 is a simplified plan view composed based on the simplified equivalent electric circuit shown in FIG. 11A.

As shown in FIG. 12, it is supposed that four power transistors Q1, Q2, Q3, and Q4 are disposed at corner part of the equivalent IC chip 100, and active regions of four power transistors Q1-Q4 are enclosed by broken lines.

A sheet-like metal layer on the Pch-power transistor Q1 constitutes one wider width bus 180 for connecting all of source electrodes, the contact pad 304a disposed immediately above the bus 180 of one source is connected to the lead frame L1 disposed on vertical axis, which forms a corner part of lead frame group, via the bonding wire 306.

A sheet-like metal layer on the Nch-power transistor Q2 constitutes one wider width bus 183 for connecting all of source electrodes, the contact pad 304a disposed immediately above the bus 183 of one source is connected to the lead frame L4 disposed on horizontal axis, which forms a corner part of lead frame group, via the bonding wire 306.

Further, the drain side of the Pch-power transistor Q1 (Q1A_D, Q1B_D) is connected to the drain side of the Nch-power transistor Q2 (Q2A_D, Q2B_D) by busses 181, 182 each comprised of two sheet-like metal layers. Namely, two drain outputs of the Pch-power transistor Q1 and two drain outputs of Nch-power transistor Q2 are connected commonly by busses 181, 182 each comprised of two sheet-like metal layers, and each one contact pad 304a disposed immediately above busses 180, 181 is connected to the lead frame L2 disposed on the vertical axis, which forms a corner part of lead frame group, via the bonding wires 306.

A sheet-like metal layer on the Pch-power transistor Q3 constitutes one wider width bus 184 for connecting all of source electrodes, the contact pad 304a disposed immediately above the bus 184 of one source is connected to the lead frame L1 disposed on the vertical axis, which forms a corner part of lead frame 307, via the bonding wire 306.

A sheet-like metal layer on the Nch-power transistor Q4 constitutes one wider width bus 187 for connecting all of source electrodes, the contact pad 304a disposed immediately above the bus 187 of one source is connected to the lead frame L4 disposed on the horizontal axis, which forms a corner part of lead frame 307, via the bonding wire 306.

Further, the drain side of the Pch-power transistor Q3 (Q3A_D, Q3B_D) is connected to the drain side of the Nch-power transistor Q4 (Q4A_D, Q4B_D) by busses 185, 186 each comprised of two sheet-like metal layers. Namely, two drain outputs of the Pch-power transistor Q3 and two drain outputs of Nch-power transistor Q4 are connected commonly by busses 185, 186 each comprised of two sheet-like metal layers, and each one contact pad 304a being disposed immediately above busses 185, 186 is being connected to the lead frame L3 being disposed on the horizontal axis, that forms a corner part of lead frame 307, via the bonding wires 306.

With these features, current routes leading to each power transistor are divided, arrangement of a plurality of power transistors is provided at corner part of integrated circuit chips according to type of circuits and therefore, both axes of the lead of package disposed on the vertical axis and horizontal axis of the package can be utilized at wire bonding. This allows increased freedom of layout of integrated circuit chips, arrangement of power transistors depending on type of circuits towards minimization of chip size, positional relationship between contact pads disposed on each of busses of a plurality of power transistors and the lead frame can be made appropriate, practical distance of the contact pad and lead of the package can be made shorter, and a plurality of wire bonding to individual terminal of the lead frame via a plurality of contact pads can be realized. Further, since length of the bonding wire can be shortened, resistance component of the bonding wire that is one of members of resistance components of the power transistor can be reduced.

By carrying out layout of the power transistor of integrated circuit chips as mentioned above, it is possible to dispose power supplying contact pads immediately above the power transistor, while a current routes leading to each power transistor is identified, thereby saving valuable silicon resources.

Further, it should not be construed that the present invention is limited to aforementioned explanations for each of embodiments. It is apparent for those skilled in the art that, by referring to the present explanation, various modifications and combinations to exemplary embodiments are possible together with other embodiments of the present invention. As one example, the present invention includes contact pads located above active parts, and generally covers a semiconductor integrated circuit in which position of these pads is selected so as to control and to distribute electric power to active parts disposed under the pads. As another example, the present invention covers semiconductor ICs that include contact pads located above active parts and disposed so as to minimize a distance for electric power distribution between one pad selected and active parts corresponding to one or a plurality of pads to which electric power should be supplied. Therefore, the scope of appended claims can include all of these modifications and embodiments.

Further, the semiconductor integrated circuit relating to the present invention and manufacturing method thereof contribute to simultaneous pursuit of lower power consumption feature and improvement of reliability with regard to performance of core semiconductor electronic parts such as power supply, motor driver, or audio amplifier through utilization of technology of pads immediately above the device and ingenuity of power integration circuit performing wire bonding immediately above active circuit region part. Therefore, the present invention, which utilizes existing facilities in the manufacture, is realized easily and with low costs and is extremely useful for less expensive, high-grade and high-performance power integrated circuit.

What is claimed is:

1. A semiconductor integrated circuit comprising:
   an integrated power transistor formed on a semiconductor substrate;
   an interlayer insulation film formed on the power transistor;
   at least one or more of first metal patterns which include a first metal layer formed immediately above the power transistor in the interlayer insulation film and function as a first electrode of the power transistor;
   at least one or more of second metal patterns which include the first metal layer and function as a second electrode of the power transistor;
   a plurality of first busses which include a second metal layer formed immediately above the first metal layer in the interlayer insulation film and are electrically connected to a corresponding first metal pattern among at least one or more of first metal patterns, each of said plurality of first busses are separated from each other by another interlayer insulation film;
   a single second bus which includes the second metal layer and is electrically connected to the at least one or more of second metal patterns; and
   contact pads formed on each of said plurality of first busses and on the single second bus.

2. The semiconductor integrated circuit according to claim 1, wherein at least one or more of contact pads are provided to the single second bus.

3. The semiconductor integrated circuit according to claim 1, wherein:
   a plurality of power transistors are disposed at a corner part of the semiconductor integrated circuit chip; and
   each of contact pads disposed immediately above at least one or more of the power transistors is connected to a corresponding lead frame via a connecting member.

4. The semiconductor integrated circuit according to claim 1, wherein each of the first busses has a different surface area.

5. The semiconductor integrated circuit according to claim 1, wherein each of the first busses has the same surface area.

6. The semiconductor integrated circuit according to claim 1, wherein the power transistor is divided into a plurality of members by a separating layer so as to correspond to each of the first busses.

7. The semiconductor integrated circuit according to claim 1, wherein the size in plan view of the power transistor is more than the size of each of the contact pads.

8. The semiconductor integrated circuit according to claim 7, wherein each of the contact pads is, in plan view, included in a region where the power transistor is formed.

9. The semiconductor integrated circuit according to claim 7, wherein some of the contact pads are, in plan view, protruded in part from a region where the power transistor is formed.

10. The semiconductor integrated circuit according to claim 7, wherein some of the contact pads are, in plan view, protruded entirely from a region where the power transistor is formed.

11. The semiconductor integrated circuit according to claim 1, wherein an area of an upper surface of the second bus is substantially equal to an area defined by the totality of areas of upper surfaces of said plurality of first busses.

* * * * *